United States Patent
Yeung et al.

(10) Patent No.: US 8,281,212 B1
(45) Date of Patent: *Oct. 2, 2012

(54) ITERATIVE ECC DECODER WITH OUT OF ORDER COMPLETION

(75) Inventors: Kwok Alfred Yeung, Milpitas, CA (US);
Kin Ming Chan, Santa Clara, CA (US);
Meng-Kun Lee, Cupertino, CA (US);
Kin Man Ng, Cupertino, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 1112 days.

This patent is subject to a terminal disclaimer.

(21) Appl. No.: 12/148,777

(22) Filed: Apr. 22, 2008

Related U.S. Application Data

(63) Continuation-in-part of application No. 11/787,140, filed on Apr. 13, 2007, now Pat. No. 7,958,427.

(60) Provisional application No. 60/920,882, filed on Mar. 30, 2007.

(51) Int. Cl.
*H03M 13/00* (2006.01)
(52) U.S. Cl. ........................................ 714/755
(58) Field of Classification Search .................. None
See application file for complete search history.

(56) References Cited

U.S. PATENT DOCUMENTS

| | | | |
|---|---|---|---|
| 5,764,646 | A | 6/1998 | Dent |
| 6,757,337 | B2 | 6/2004 | Zhuang et al. |
| 7,032,156 | B2 | 4/2006 | Yu et al. |
| 7,127,664 | B2 | 10/2006 | Nicol et al. |
| 7,978,793 | B2 | 7/2011 | Anekoji |
| 2002/0129318 | A1 | 9/2002 | Campello De Souza et al. |
| 2008/0276156 | A1 | 11/2008 | Gunnam et al. |
| 2008/0301521 | A1 | 12/2008 | Gunnam et al. |
| 2009/0177945 | A1 | 7/2009 | Djordjevic et al. |
| 2009/0193313 | A1 | 7/2009 | Kong et al. |
| 2010/0042906 | A1 | 2/2010 | Gunnam et al. |
| 2011/0060969 | A1* | 3/2011 | Ramamoorthy et al. ..... 714/773 |

* cited by examiner

*Primary Examiner* — Guerrier Merant
(74) *Attorney, Agent, or Firm* — Van Pelt, Yi & James LLP

(57) ABSTRACT

Processing a sequence of data frames in an error correction code (ECC) decoder is disclosed. Processing includes receiving a first data frame in the sequence of data frames, storing the first data frame, initiating processing of the first data frame using the ECC decoder that includes a faster stage and a slower stage, receiving a second data frame from the input sequence of data frames, storing the second data frame, and initiating processing of the second data frame through the ECC decoder before the first data frame is finished being processed using the ECC decoder.

23 Claims, 18 Drawing Sheets

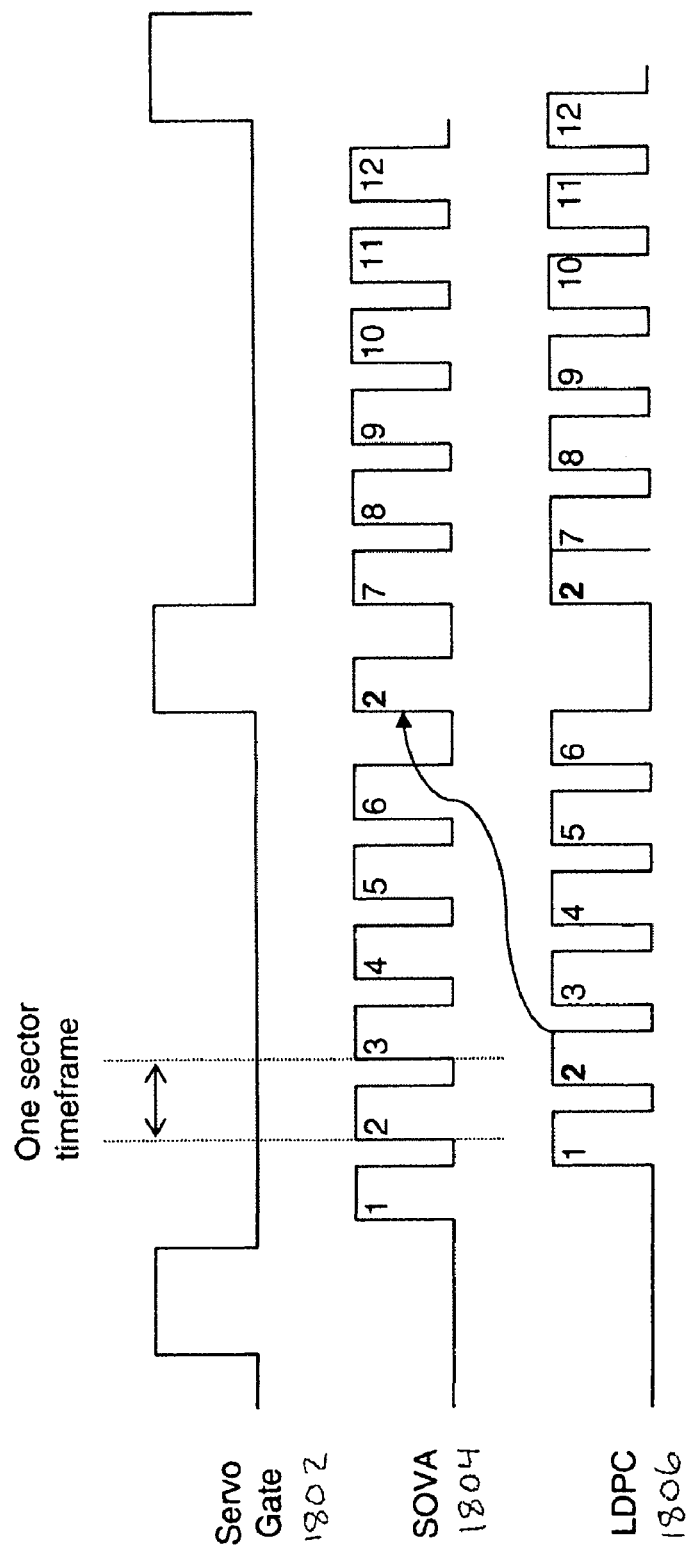

ITERATIVE ECC DECODER WITH OUT OF ORDER COMPLETION

CROSS REFERENCE TO OTHER APPLICATIONS

This application is a continuation in part of U.S. patent application Ser. No. 11/787,140 entitled ECC WITH OUT OF ORDER COMPLETION filed Apr. 13, 2007 now U.S. Pat. No. 7,958,427, which claims priority to U.S. Provisional Patent Application No. 60/920,882 entitled ECC WITH OUT-OF-ORDER COMPLETION filed Mar. 30, 2007, which are incorporated herein by reference for all purposes.

BACKGROUND OF THE INVENTION

Error correction codes (ECC) are used in a variety of systems, including in data storage and communications. While older ECC decoder designs have a fixed processing latency, newer ECC designs, such as iterative low density parity check (LDPC) decoders, iterative Reed Solomon (RS) decoders, and other iterative ECC decoders, may have a variable latency which may cause a long delay. For example, one new system for processing received data has a RS decoder and an LDPC decoder. A straightforward way of processing data using this system would be to maintain sequencing in the data path. For example, data coming out has the same sector numbers or ordering as the data coming in. However, this straightforward data handling approach may have some drawbacks such as long latency and/or large memory requirements in the event there is a sector with a large amount of error and/or two sectors with large amounts of error are located very near each other in a sequence of sectors. It would be useful to develop some techniques for processing data which reduce memory requirements and/or latency.

BRIEF DESCRIPTION OF THE DRAWINGS

Various embodiments of the invention are disclosed in the following detailed description and the accompanying drawings.

FIG. 18 is a diagram illustrating an example timing diagram.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
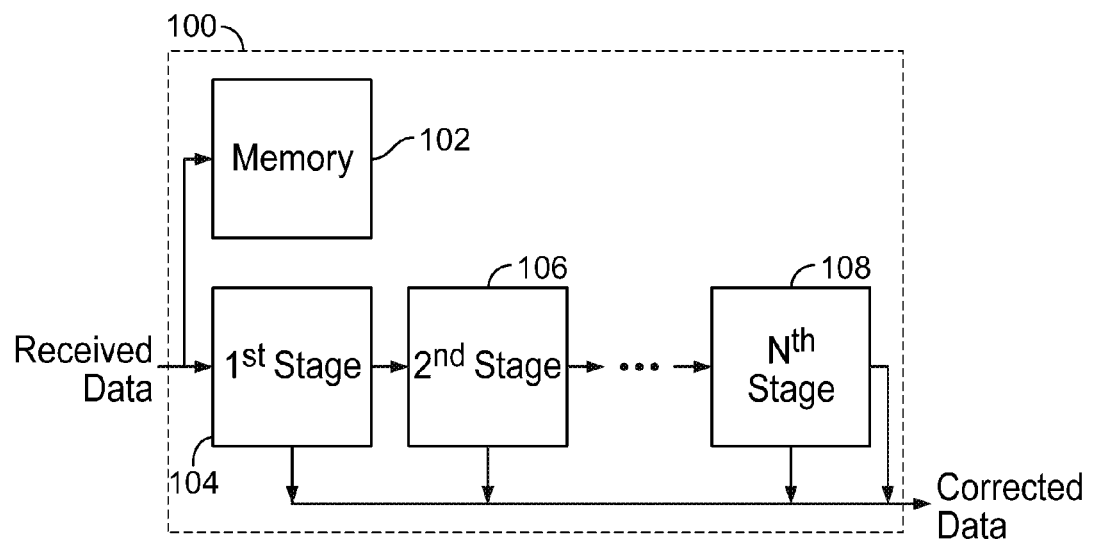
FIG. 1 is a block diagram illustrating an embodiment of an ECC decoder implementation.

FIG. 1 is a block diagram illustrating an embodiment of an ECC decoder implementation. In various embodiments, ECC decoder 100 may be used in a storage device, such as a hard disk, or a communications device, such as a wireless receiver. In some embodiments, ECC decoder is an iterative Reed Solomon decoder, an iterative LDPC decoder, or a decoder corresponding to another error correction code.

In the example shown, ECC decoder 100 includes memory 102, first stage 104, second stage 106, and Nth stage 108 corresponding to N stages of processing blocks in ECC decoder 100, where N is any number. Examples of processing that may be performed by the processing blocks include syndrome computation, Berlekamp Massey formula computation, and the Chien Search. In some embodiments, data is processed through one or more stages and then returns to a previous stage to be re-processed, as more fully described below.

In the examples described herein, although data (or a data frame) may be described as being processed in (or through) a stage, it is not necessarily the data (or the data frame) being processed in (or through) the stage. It could be any information associated with the data. In various embodiments, data, processed data, and/or other information associated with the data (such as correction information, reliability information, etc.) may be what is processed in (or through, passed to, or transferred between) one or more stages. For example, in some cases, modified reliability information is processed in (or through) a stage and then used to correct data stored in memory, as more fully described below.

As shown in this example, received data is received at an input to ECC decoder 100. For example, the received data may be received from a hard disk channel (i.e., read from a hard disk) or a wireless channel. In some embodiments, the received data was encoded using an ECC code prior to transmission or storage. The received data is provided as input to ECC decoder 100, which stores the received data in memory 102, processes the received data through one or more of the N stages 104-108 and outputs corrected data. In some embodiments, while the received data is being processed in decoder 100, the received data is stored in memory 102. When it is finished being processed, it is released from memory 102.

In some embodiments, one or more of stages 1-N (blocks 104-108) has variable latency; that is, the amount of time it takes to process received data through decoder 100 varies depending on the received data. For example, one or more of blocks 104-108 may require one or more iterations depending on the nature of the errors in the received data. This may occur if decoder 100 is an iterative decoder, for example. In some embodiments, processing beyond the first stage 104 of decoder 100 is conditional; some data may be processed through only one stage before it is output as corrected data, while some data may be processed through two or more stages before it is output as corrected data. In some embodiments, the latency is unpredictable and it is not known in advance how long it will take to process the data through one or more of blocks 104-108.

Decoder 100 may process received data "in order" or "out of order". In the case of in order, data is processed through the stages in the order in which it was received. In the case of out of order, data is not necessarily processed through the stages in the order in which it was received. In order processing and out of order processing is more fully described below.

In the case of out of order processing, while received data is being processed through ECC decoder 100, any subsequently received data needs to be stored in memory 102 until it can be processed. Because the amount of time it takes to process a given set of received data through ECC decoder 100 is variable, the size of memory 102 needs to be large enough to be able to store all received data during a worst case delay. This may vary depending on the specification or requirements. In some embodiments, the worst case delay is associated with a worst case disk sector. For example, if the worst case disk sector processing time is T, then the memory needs to be able to store the number of data frames received during time T. In this case, the memory can handle one worst case disk sector every period T, but if it receives more than one worst case disk sector in a period T, then there is not enough memory to store all the received data frames. This results in data loss or data error.

In some embodiments, the received data comprises a data frame or sequence of data frames. A data frame, as used herein, refers to a set of data having a fixed (or variable) length. The length of a data frame may be constant or change depending on the data. The length may be predetermined or known in advance, or the length may be indicated with the data. In some embodiments, a data frame is associated with a (disk) sector. In the examples described herein, although a sector may be described, any other data frame may be used in various embodiments.

Figure 2:
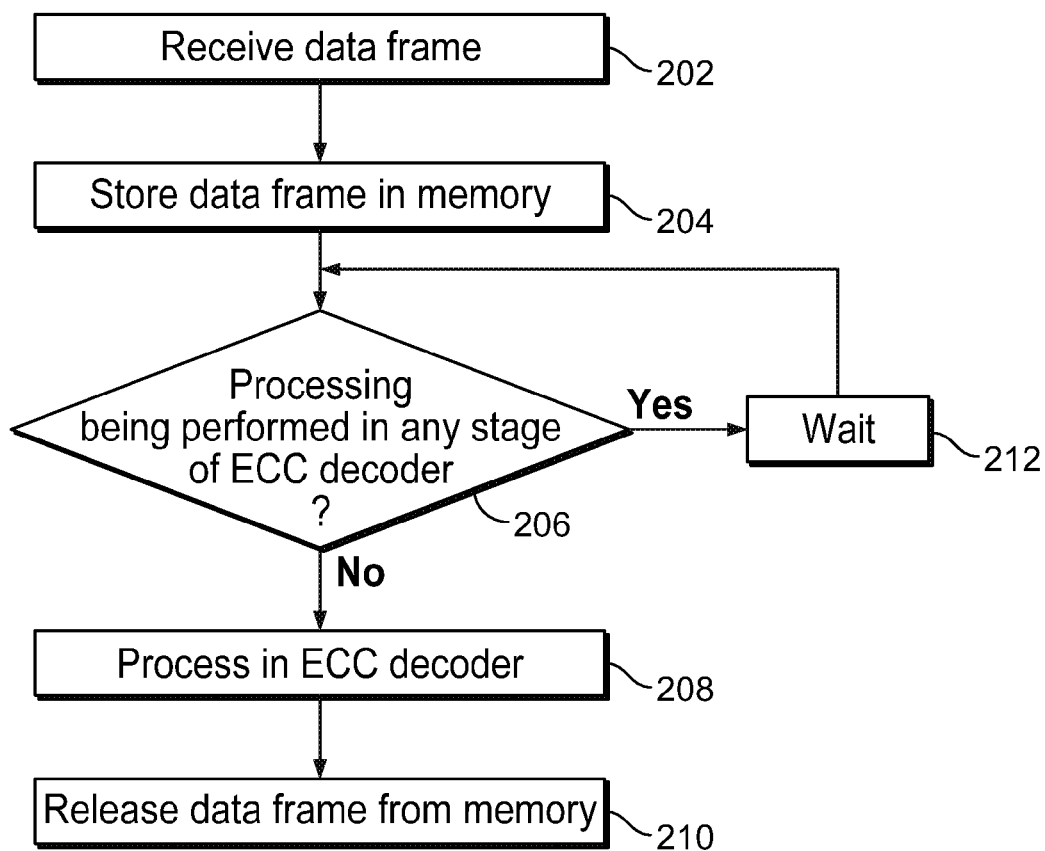
FIG. 2 is a flowchart illustrating an embodiment of a process for decoding data in the case of in order processing.

FIG. 2 is a flowchart illustrating an embodiment of a process for decoding data in the case of in order processing. For example, this process may be performed by decoder 100. In the example shown, at 202, a data frame is received. For example, a sector of data is received at the input to decoder 100. The data frame was encoded using an ECC code prior to transmission or storage. At 204, the data frame is stored in memory. For example, the data frame is stored in memory 102. At 206, it is determined whether processing is being performed in any stage of the ECC decoder. If it is determined that processing is being determined in one or more stages of the ECC decoder, then the process waits at 212 and the determination at 206 is made again. In some embodiments, the process waits a predetermined amount of time before checking again. In some embodiments, the process waits until it receives a notification, such as a notification that the ECC decoder is ready and/or available to perform ECC processing on the received data frame. If it is determined that processing is not being performed in any stage of the ECC decoder, then at 208, the data frame is processed in the ECC decoder. For example, the data frame is processed in the first stage 104 of the ECC decoder 100. When the data frame is finished processing through ECC decoder 100, the received data frame is released from memory at 210.

In this example, as long as the ECC decoder is processing a data frame, no other data frame may be processed in the ECC decoder. This means that any data frames received while the ECC decoder is occupied (i.e., processing another data frame) needs to wait in memory until the ECC decoder is free (i.e., not processing any data frames) and available to start processing the data frame. In some cases, this requires a relatively large memory. The overall processing time of a set of any M data frames may be relatively long. A data frame that takes a longer time to process may cause a back up. It would be desirable to be able to reduce the required memory size and/or the processing time.

Figure 3:
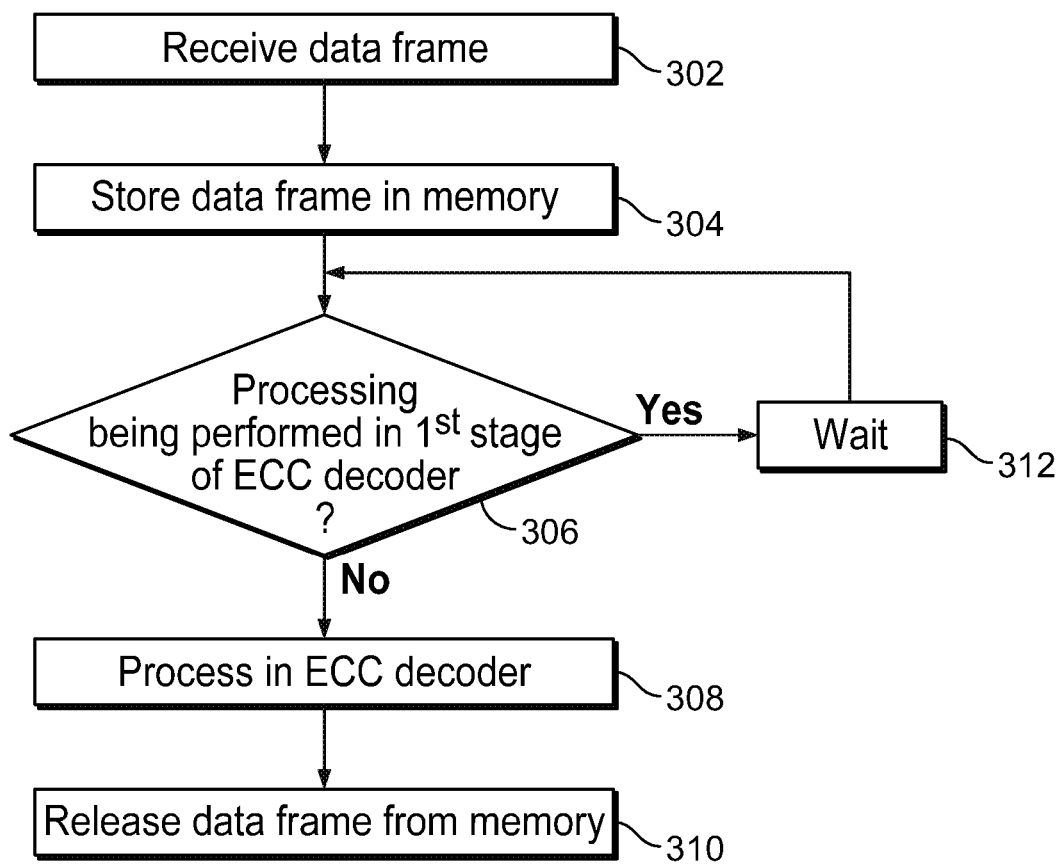
FIG. 3 is a flowchart illustrating an embodiment of another process for decoding data in the case of out of order processing.

FIG. 3 is a flowchart illustrating an embodiment of another process for decoding data in the case of out of order processing. For example, this process may be performed by decoder 100. In the example shown, at 302, a data frame is received. For example, a sector of data is received at the input to decoder 100. The data frame was encoded using an ECC code prior to transmission or storage. At 304, the data frame is stored in memory. For example, the data frame is stored in memory 102. At 306, it is determined whether processing is being performed in the first stage of the ECC decoder. If it is determined that processing is being determined in the first stage of the ECC decoder, then the process waits at 312 and the determination at 306 is made again. In some embodiments, the process waits until it receives a notification, such as a notification that the first stage of the ECC decoder is ready and/or available to process the received data frame. If it is determined that processing is not being performed in the first stage of the ECC decoder, then at 308, the data frame is processed in the ECC decoder. For example, the data frame is processed in the first stage 104 of the ECC decoder 100. When the data frame is finished processing through ECC decoder 100, the received data frame is released from memory at 110.

In this example, if the ECC decoder is not processing a data frame in the first stage of the ECC decoder, another data frame may be processed in the ECC decoder. This means that any data frames received while the ECC decoder is processing another data frame through the 2nd through Nth stages do not need to wait in memory and can start being processed in the first stage of the ECC decoder. This process may require less memory than the process of FIG. 2, in which the ECC decoder cannot start processing a new data frame until all N stages of it are finished processing a previous data frame. In addition, the overall processing time of a set of any M data frames may be shorter using this process than it would be in the process of FIG. 2. Thus, this process enables a reduced memory size and/or processing time.

Figure 4:
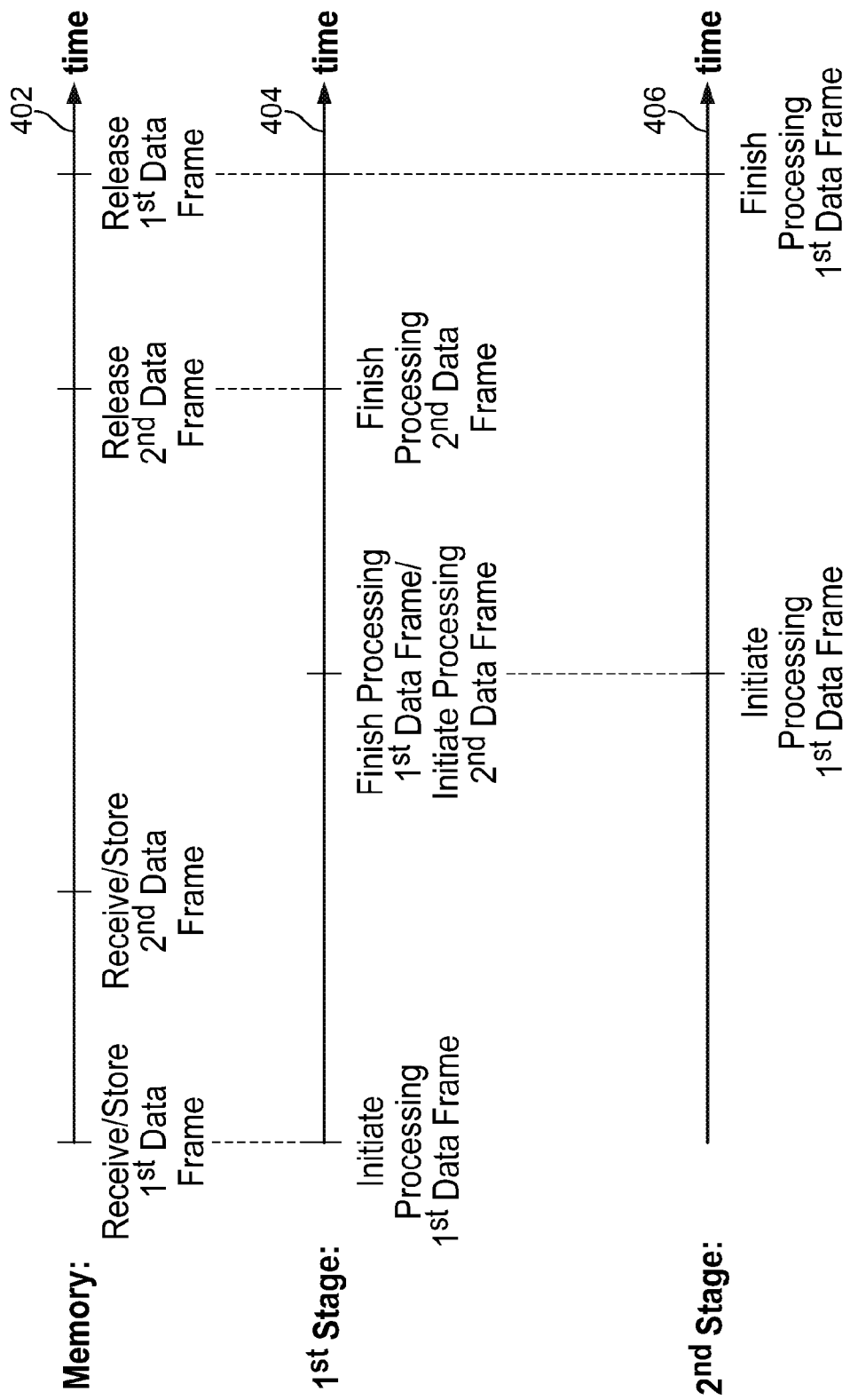
FIG. 4 is a diagram illustrating an example of events that occur within various blocks of a decoder over a given period of time.

FIG. 4 is a diagram illustrating an example of events that occur within various blocks of a decoder over a given period of time. In this example, a decoder, such as decoder 100, receives two data frame. The decoder includes a memory, such as memory 102; a first stage processing block, such as first stage 104; and a second stage processing block, such as second stage 106. In the example shown, time line 402 corresponds to the memory, timeline 404 corresponds to the first stage processing block, and timeline 406 corresponds to the second stage processing block.

This example shows the events that occur in the memory, first stage processing block, and second stage processing block when two data frames are received sequentially at the input to the decoder. In this example, the first data frame requires processing through the first and second stages. For example, the first data frame is processed through the first stage, and then is processed through the second stage, where the second stage is an iterative process that takes a variable amount of time. In this example, the second data frame only requires processing through the first stage.

Starting from the left, a first data frame is received and stored in memory as shown in time line 402. Processing of the first data frame is initiated in the first stage of the decoder, as shown in time line 404. The next event occurs in the memory, when a second data frame is received and stored, as shown in time line 402. Because the first stage is still busy processing the first data frame, the second data frame waits in memory. Next, the first stage is finished processing the first data frame and processing is initiated on the second data frame, as shown in time line 404. The second stage begins processing the first data frame (or information associated with the first data frame), as shown in time line 406. Next, the first stage is finished processing the second data frame, as shown in time line 404. The second data frame is released from memory, as shown in time line 402. When the second stage is finished processing the first data frame (time line 406), the first data frame is released from memory, as shown in time line 402.

In this example, even though the first data frame is still being processed in the ECC decoder, the second data frame can be processed in the first stage. In other words, both the first and the second data frame can be simultaneously processed in the ECC decoder in different stages. In other embodiments, any number of data frames may be simultaneously processed in any number of stages. As a result, output data frames of decoder 100 are not necessarily first in first out (FIFO) or in order (i.e., in the same order as the corresponding input data frames). In other words, the first data frame to be received at the input of decoder 100 is not necessarily the first corrected data frame to be output from decoder 100. Because the corrected data frames at the output are not necessarily in order, there is a mechanism for keeping track of the desired order.

This process is an example of out of order processing, out of order execution, or out of order completion. In other words, the corrected data frames output by the ECC decoder are not necessarily in order because they may have been processed out of order within the ECC decoder. By contrast, the process of FIG. 2 is an example of in order processing or in order completion. Because each data frame in FIG. 2 is processed in sequence through the N stages of the ECC decoder, the corrected data frames output by the ECC decoder are in order (i.e., in the same order as the corresponding input data frames).

In some embodiments, there is a management process that reorders the data frames downstream from the ECC decoder. In various embodiments, the management process is performed by hardware, firmware, and/or software. In some embodiments, the management process is able to handle cases in which there is an error (i.e., the ECC decoder was not able to decode the received data frame) and keep track of this. In some embodiments, the management process keeps track of sequence numbers associated with received data frames, such as segment or sector numbers. When a data frame is received and it is not the next data frame in the sequence, then a gap is left for the data frame to be filled in later when the correct data frame is received. In some embodiments, the gap size is based at least in part on the data frame size. In some embodiments, the data frame size is known. In cases in which the data frame size is not known, the data frame size may be sent in advance (e.g., in sequence with the other data frames), or a variable gap size is stored. In some embodiments, pointers are used to implement the management process. For example, if pointers are used to store the corrected data frames, a pointer is able to reference a memory block of any size so that a data frame of any size can be stored once it is received.

Figure 5:
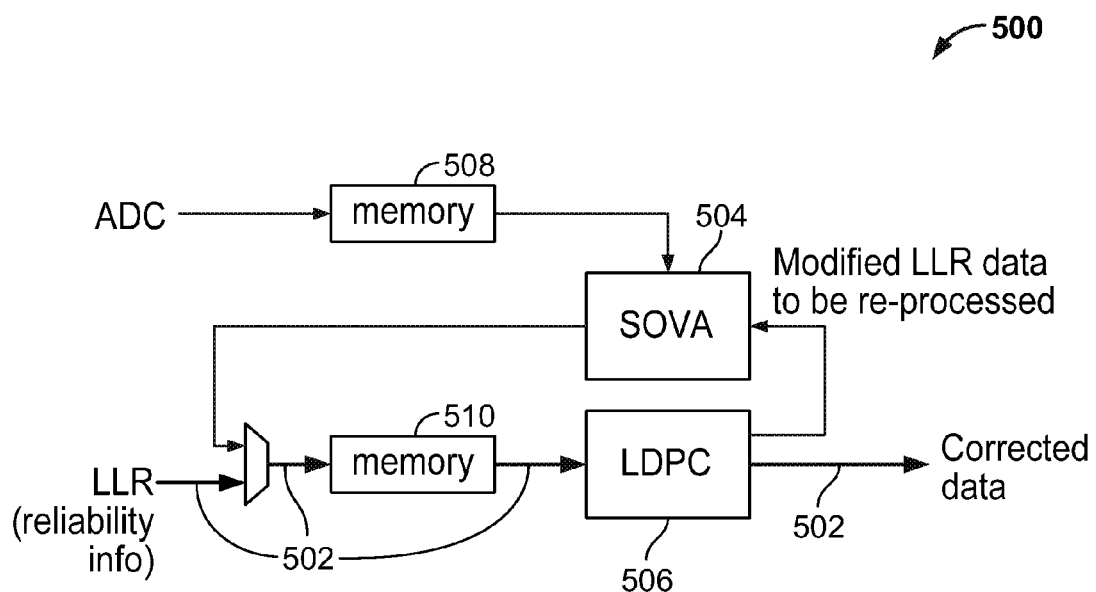
FIG. 5 is a block diagram illustrating an embodiment of an iterative LDPC decoder.

FIG. 5 is a block diagram illustrating an embodiment of an iterative LDPC decoder. In the example shown, decoder 500 is an iterative LDPC decoder and is an example of decoder 100. In this example, decoder 500 is shown to include memory 508, memory 510, LDPC decoder 506, and Soft Output Viterbi Algorithm (SOVA) (engine) 504. LDPC decoder 506 performs LDPC decoding and decoder 500 performs iterative LDPC decoding. Reliability information is provided as input to decoder 500. In some embodiments, data is received from an analog to digital converter (ADC) and provided as input to memory 508. Corrected data is output.

The thick arrows 502 in the diagram show the data path of the LDPC decoder 500. Reliability information, e.g., log likelihood ratio (LLR), is used for decoding in LDPC block 500. In some embodiments, the data can be derived or otherwise obtained from the reliability information. When the LDPC block 500 cannot correct the data sector within a pre-defined timeframe, a re-processing procedure is performed through the SOYA engine 504. LLR is reliability information. In this and the other examples described herein, other reliability information may be used besides LLR.

The re-processing procedure starts with the re-capturing of the LDPC modified LLR by the SOYA 504. The SOYA 504 uses the modified LLR, together with ADC samples to re-process the data. It then feed the re-processed data back to the original LDPC decoder 506 for a second round of LDPC decoding. The LDPC decoder 506 decodes this data in which a higher chance of correction probability is expected.

In some instances, the LDPC decoder 506 performs internal iterations to decode the data which might take more than a single data sector timeframe. A memory 510 is used before the LDPC decoder 506 to store the incoming data while the iterations are taking place.

In this example, the LDPC decoder 506 has an internal iteration capacity of 4. This means it can carry out 4 iterations in a single sector timeframe. A single sector timeframe is the time it takes to receive one sector. As used herein, a timeframe is the time it takes to receive a data frame, such as a sector. For a sector which does not require iteration, ¼ of the processing time is used. A sector requiring 3 iterations can be decoded and corrected by LDPC 506 before the start of the next timeframe. In this example, LDPC decoder 506 will give up decoding and kick off SOVA re-processing after 8 iterations on the same data sector; that is, after LDPC 506 has spent 2 sector timeframes iterating the sector, the sector is processed by SOVA 504.

In this example, the SOVA 504 takes 2 sector timeframes to re-process the data in a second round. The LDPC decoder 506 then re-processes the data for a maximum of 4 iterations (1 sector timeframe). It gives up if data still cannot be decoded after that.

An example of processing through decoder 500 is more fully described below.

Figure 6:
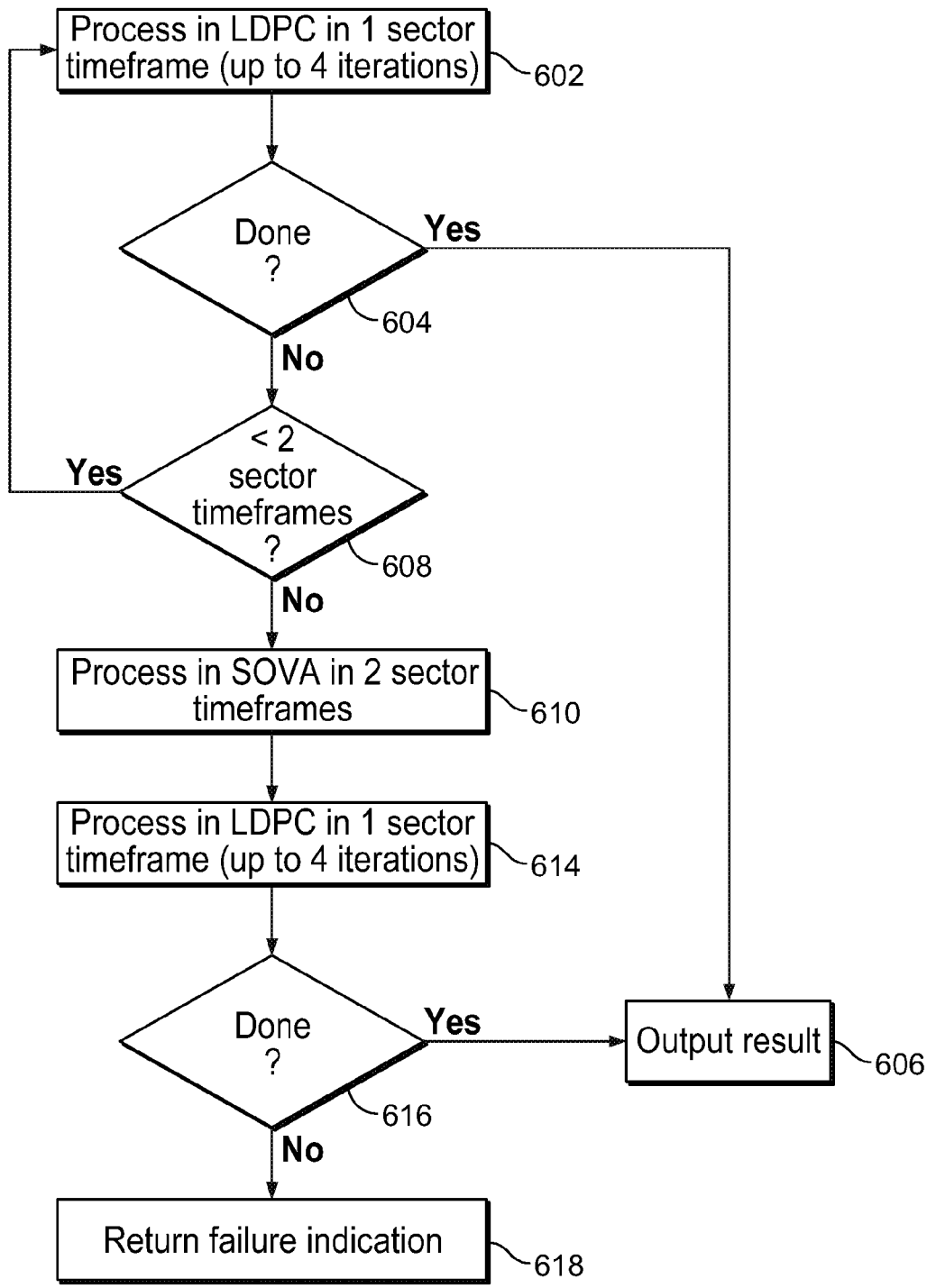
FIG. 6 is a flowchart illustrating an embodiment of a process for decoding data.

FIG. 6 is a flowchart illustrating an embodiment of a process for decoding data. For example, this process may be performed by decoder 500. In some embodiments, this process is used to perform 208 in FIG. 2 or 308 in FIG. 3. In this example, the received data frame is a sector.

In the example shown, at 602, the received sector is processed in the LDPC in one sector timeframe. In this example, processing one sector takes ¼ sector timeframe. However, up to four iterations may be performed. At a minimum, it takes ¼ sector timeframe to process the sector through the LDPC.

At 604, it is determined whether the LDPC is done processing the sector, e.g., if the sector is decoded and corrected. If it determined to be done, then the result is output at 606, e.g., the corrected sector is output. If it is not done, then at 608, it is determined whether fewer than 2 sector timeframes have been spent by the LDPC processing this sector. If fewer than 2 sector timeframes have been spent, then the process returns to 602 and the sector is processed by the LDPC again. This is because the LDPC decoder can spend up to two sector timeframes iterating on the sector. If 2 sector timeframes have been spent, then at 610, the sector (or information associated with the sector, such as modified LLR data) is processed in the SOVA in 2 sector timeframes. In this example, the SOVA takes 2 sector timeframes to process data. One sector timeframe is equivalent to 4 iterations time, therefore in this example it is interchangeable to describe the time of processing SOVA 504 as 2 sector timeframes or 8 iterations time. At 614, the sector (or information associated with the sector) is processed in the LDPC in one sector timeframe (up to 4 iterations), as in 602. At 616, it is determined whether the LDPC is done processing the sector (e.g., whether the sector is decoded and corrected). If it determined to be done, then the result is output at 606 (e.g., the corrected sector is output). If it is not done, then at 618, a failure indication is returned. In other words, the decoder gives up attempting to decode the sector and returns an indication of this.

Figure 7:
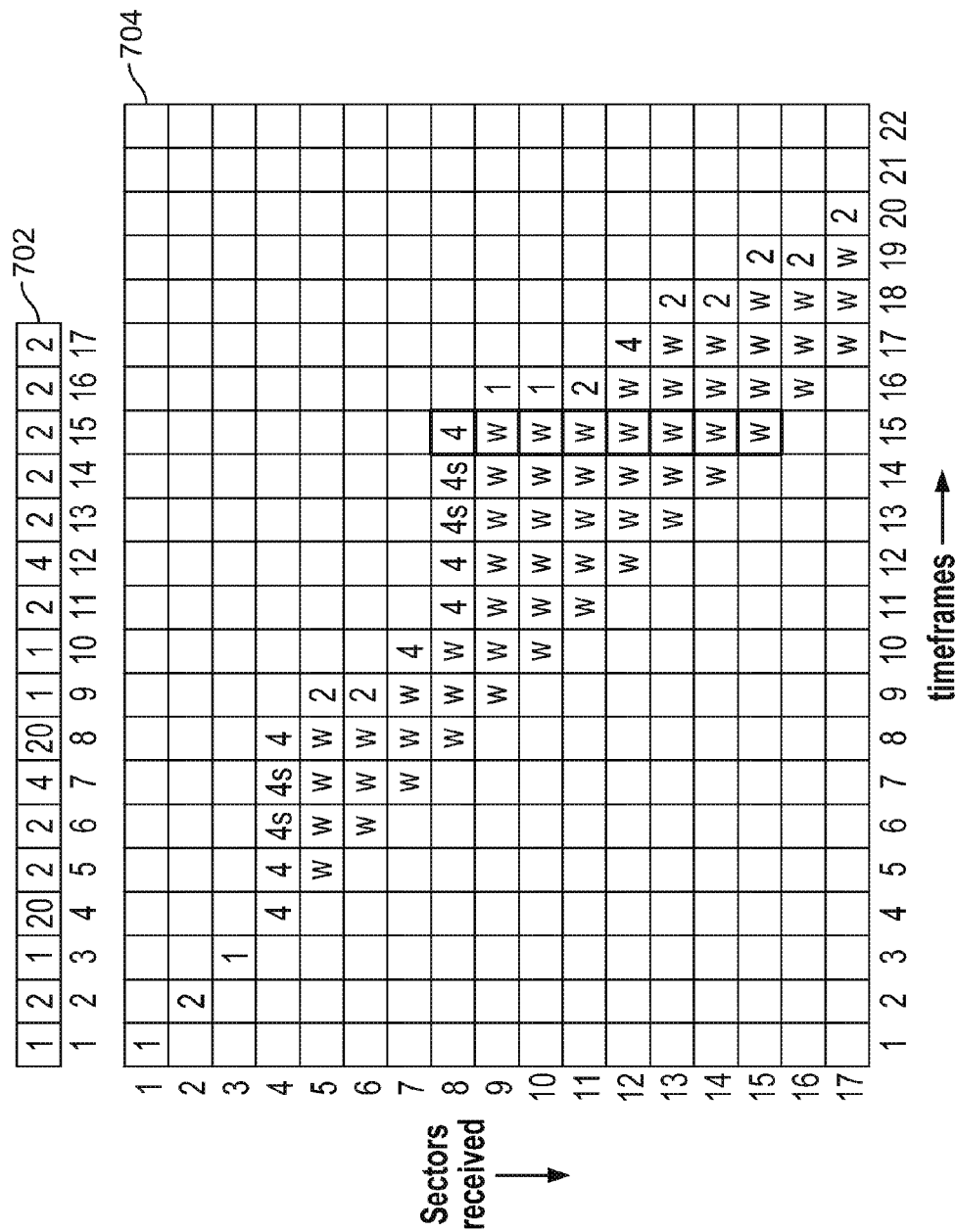
FIG. 7 is a diagram illustrating an example of data sectors processing in order through decoder 500 according to the process of FIG. 6.

FIG. 7 is a diagram illustrating an example of data sectors processing in order through decoder 500 according to the process of FIG. 6.

In this example, data sector profile 702 includes a total of 17 sectors (corresponding to 17 boxes), entering the LDPC decoder from left to right. The first sector (sector 1) corresponds to the first (left most) box, the second sector (sector 2) corresponds to the second box, and the 17th sector (sector 17) corresponds to the 17th (right most) box. The numbers in each box indicate the number of iterations required for that particular sector. For example, 20 means processing that sector requires 4+4 iterations (2 sector timeframes) in the first round LDPC, 4+4 (equivalent to 2 sector processing time of SOVA) iterations in the SOVA engine and 4 iterations (1 sector timeframe) in the second round LDPC.

Diagram 704 shows the latency experienced by each data sector as the data sectors corresponding to data sector profile 702 are processed through the LDPC decoder for the case of in order processing, i.e., with the sectors being processed through the decoder in the order in which they were received. In this example, each column corresponds to a sector timeframe, with time increasing from left to right. Each row corresponds to a received sector, where the first received sector corresponds to the first row, the second received sector corresponds to the second row, etc.

The number in each box indicates the number of iterations performed in that timeframe for a particular sector. "w" means the data sector is waiting in memory without any processing being performed on that data sector. 4s means 4 iterations time (i.e. 1 sector timeframe) are executed in the SOVA engine. As the LDPC decoder can only do 4 iterations in each sector timeframe, the sum of numbers in each column should not be higher than 4. The received sectors are shown in data sector profile 702. One sector is received per timeframe.

The way this diagram works is as follows. The first sector received corresponds to the first (left most) box of data sector profile 702. The first box contains "1", which means it requires 1 iteration to be complete. Referring to diagram 704, the box in the first row and first column corresponds to the first sector received. Because it takes 1 iteration to be complete, the first sector is fully processed during the first timeframe (i.e., first column, since each column corresponds to a timeframe).

In the second column, sector 2 is received. As shown in data profile 702, sector 2 requires 2 iterations. As shown in diagram 704, the 2 iterations are completed within sector 2.

Jumping ahead, the fourth received sector requires 20 iterations, as shown in data sector profile 702. In diagram 704, in the fourth column, sector 4 is received. 4 iterations are performed in the fourth timeframe (i.e., fourth column), 4 iterations are performed in the fifth timeframe, 4 iterations time (i.e. 1 sector timeframe) in the SOVA engine are executed in the sixth timeframe (as indicated by "4s"), etc. In the meantime, at each timeframe, a new data sector is received and must wait. By timeframe 6, there are 2 sectors waiting to be processed. By timeframe 8, when the iterative LDPC decoder finishes processing sector 4, there is a queue of 4 sectors waiting to be processed. At timeframe 9, sector 9 is received and must wait. However, the next sector in the queue in memory (sector 5) can now be processed. It only takes 2 iterations, so the next sector (sector 6) can also be processed in the same timeframe. This is because the LDPC is able to perform 4 iterations in a timeframe. Sector 6 also only requires 2 iterations. Therefore, during timeframe 9, both sectors 5 and 6 are processed. However, there is still a queue of 3 sectors in memory waiting to be processed, and even though all sectors are received by timeframe 17, it is not until timeframe 20 when they are all finished being processed through the iterative LDPC decoder.

The maximum memory size needed for the in order case is 8 sectors. This is indicated by the boxes in bold. The boxes in bold show that at that point in time (timeframe 15), 1 sector is being processed in the LDPC and 7 sectors are waiting in memory. In order processing produces output data in the order in which it came in. This allows straightforward data flow management but a larger memory size may be required. Also, the processing latency may be higher.

Figure 8:
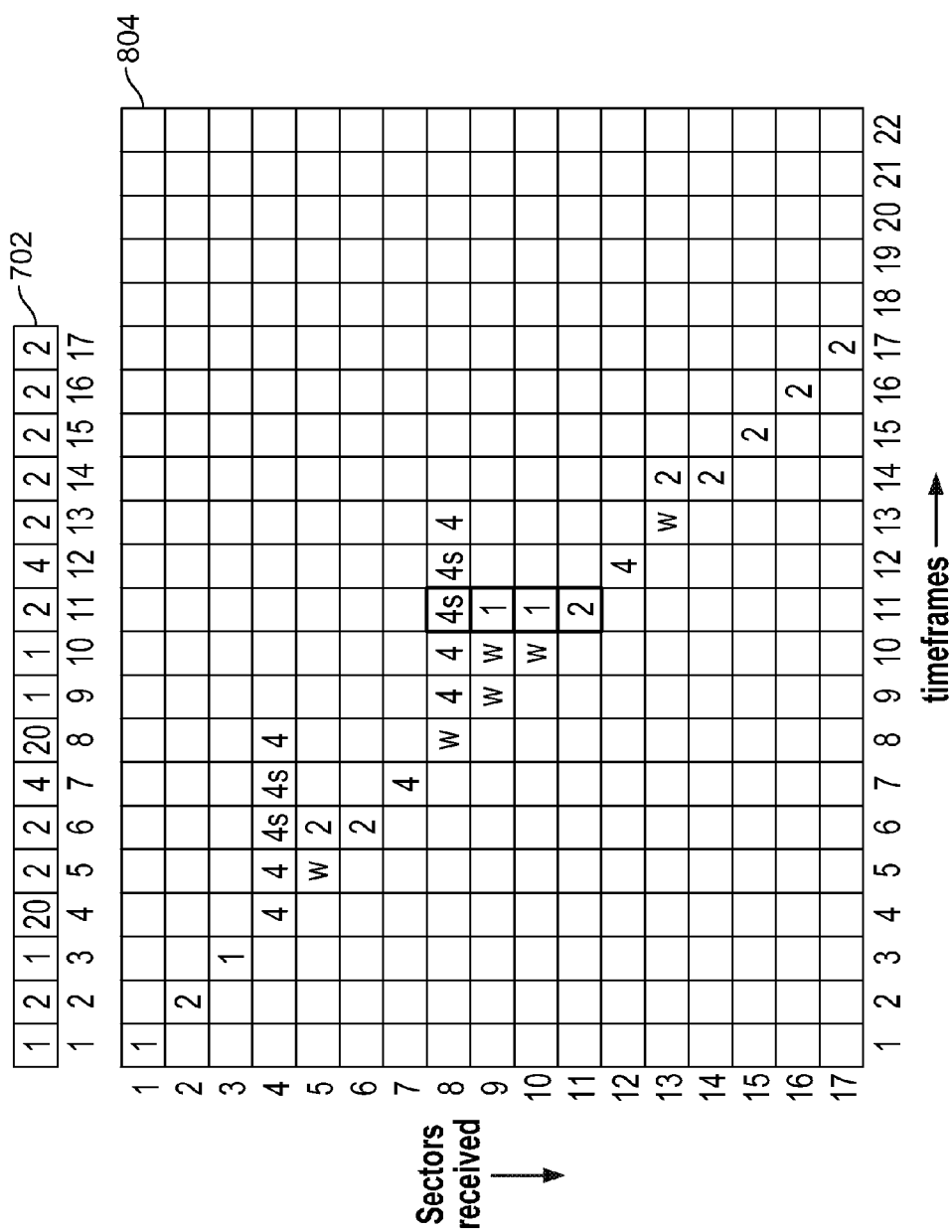
FIG. 8 is a diagram illustrating an example of data sectors processing out of order through decoder 500 according to the process of FIG. 6.

FIG. 8 is a diagram illustrating an example of data sectors processing out of order through decoder 500 according to the process of FIG. 6. In this example, the same data sector profile 702 is received.

Diagram 804 shows the latency experienced by each data sector as the data sectors corresponding to data sector profile 702 are processed through the LDPC decoder for the case of out of order processing, i.e., the sectors are not necessarily processed through the decoder in the order in which they were received. In the out of order case, data that requires shorter processing time can move ahead of the data that requires a longer processing time. The output order depends also on the error profile of the incoming data instead of the input sequence alone. In some embodiments, the out of order execution requires minor modifications on data flow handling compared to the in order execution case.

Sectors 1-4 are processed in a similar manner to that shown in FIG. 7. At timeframe 4, sector 4 is received. Sector 4 requires 20 iterations, as shown in data sector profile 702. 4 iterations are performed in the fourth timeframe (i.e., fourth column), 4 iterations are performed in the fifth timeframe, 4 iterations time in the SOVA engine are executed in the sixth timeframe (as indicated by "4s"), etc. In the meantime, at each timeframe, a new data sector is received. At the fifth timeframe (timeframe 5), data sector 5 is received. Because the LDPC is still processing sector 4, sector 5 waits in memory. However, at timeframe 6, the LDPC is finished processing sector 4; sector 4 is now being processed by the SOVA engine. Therefore, sector 5 can now be processed by the LDPC. As shown in data sector profile 702, sector 5 only requires 2 iterations, so after sector 5 is processed, sector 6, which also requires 2 iterations, is processed in the same timeframe. Therefore during timeframe 6, not only is sector 5 processed by the LDPC, but also sector 6, which was just received at timeframe 6. At the same time, the LDPC is processing sector 4.

Referring back to FIG. 1, the LDPC can be considered a first stage and the SOVA engine can be considered a second stage of processing in ECC decoder 100. In this case, if a data frame is processed in the second stage, it returns to the first stage. Stage 2 is conditional. Once a sector is finished being processed in stage 1, another sector may begin being processed in stage 1.

As shown by diagram 804, latency is reduced compared to diagram 704 (the in order processing case). In other words, at any given time in memory, there are fewer sectors waiting to be processed by the iterative LDPC decoder than in the in order processing case described in FIG. 7. In this case, by the time sector 17 is received, sector 17 can be immediately processed, and therefore it takes 17 timeframes to process the 17 sectors of data sector profile 702.

In this out of order execution case, the memory size requirement may be significantly reduced compared to the in order case. In this example, the maximum memory size needed is 4 sectors, as indicated by the boxes in bold compared to a required memory size of 8 sectors in the in order case of FIG. 7. The boxes in bold show that at that point in time (timeframe 11), 1 sector is being processed in the SOVA engine and 3 sectors are being processed in the LDPC. In addition, the total processing time is reduced. Total processing takes 17 timeframes (as opposed to 21 timeframes in the in order case shown in FIG. 7).

Figure 9:
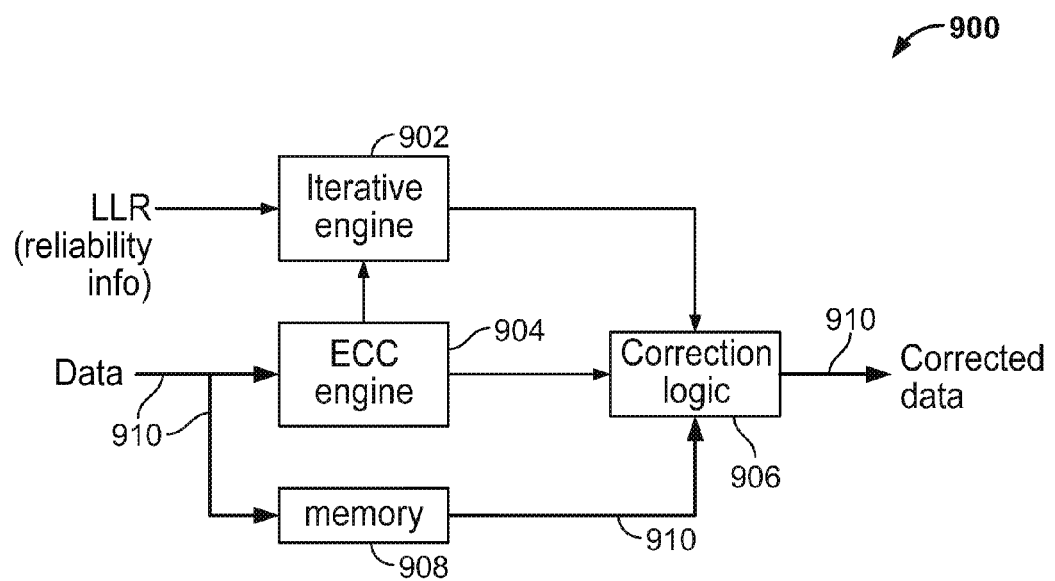
FIG. 9 is a block diagram illustrating an embodiment of a soft ECC decoder.

FIG. 9 is a block diagram illustrating an embodiment of a soft ECC decoder. In the example shown, decoder 900 is a soft ECC decoder and is an example of decoder 100. In this example, decoder 900 is shown to include iterative engine 902, ECC engine 904, correction logic 906, and memory 908. Data is received and provided as input to ECC engine 904 and memory 908. LLR is provided as input to iterative engine 902. Corrected data is output.

The thick arrows 910 in the diagram show the data path of the soft ECC decoder 900. In this example, there is ECC processing, followed by a correction step (correction logic 906). The memory 908 is used to store the sector data while the ECC decoding is in progress. The longer the decoding time, the longer the wait and the bigger the memory needed.

The ECC engine 904 is able to determine if the sector can be corrected in one stage. If the sector is uncorrectable in one stage, it will be sent to an iterative engine 902 for further processing. The time it takes for the iterative engine computation varies with the error profile of the data. After the iterative engine 902 successfully processes the data, the data will be sent to correction logic 906 as in the one stage case.

The ECC engine 904 has the processing capacity of 2 sectors per sector timeframe. This means that when iterative processing is not needed, the ECC engine 904 finishes processing the sector in a ½ sector timeframe. In some embodiments, when iterative processing is needed, the ECC engine finishes processing the sector in a ½ sector timeframe. The extra processing power can be used when there is a backlog in the memory. In that case, ECC engine 904 can process 2 sectors in each timeframe. In this example, the ECC engine 904 only does first time processing on a data sector, but not subsequent iterations. Iterations are done by the iterative engine 902.

In this example, it is assumed that ECC engine 904 can process 2 sectors of data in each sector timeframe and the iterative engine can process 4 iterations in each sector timeframe.

An example of processing through decoder 900 is more fully described below.

Figure 10:
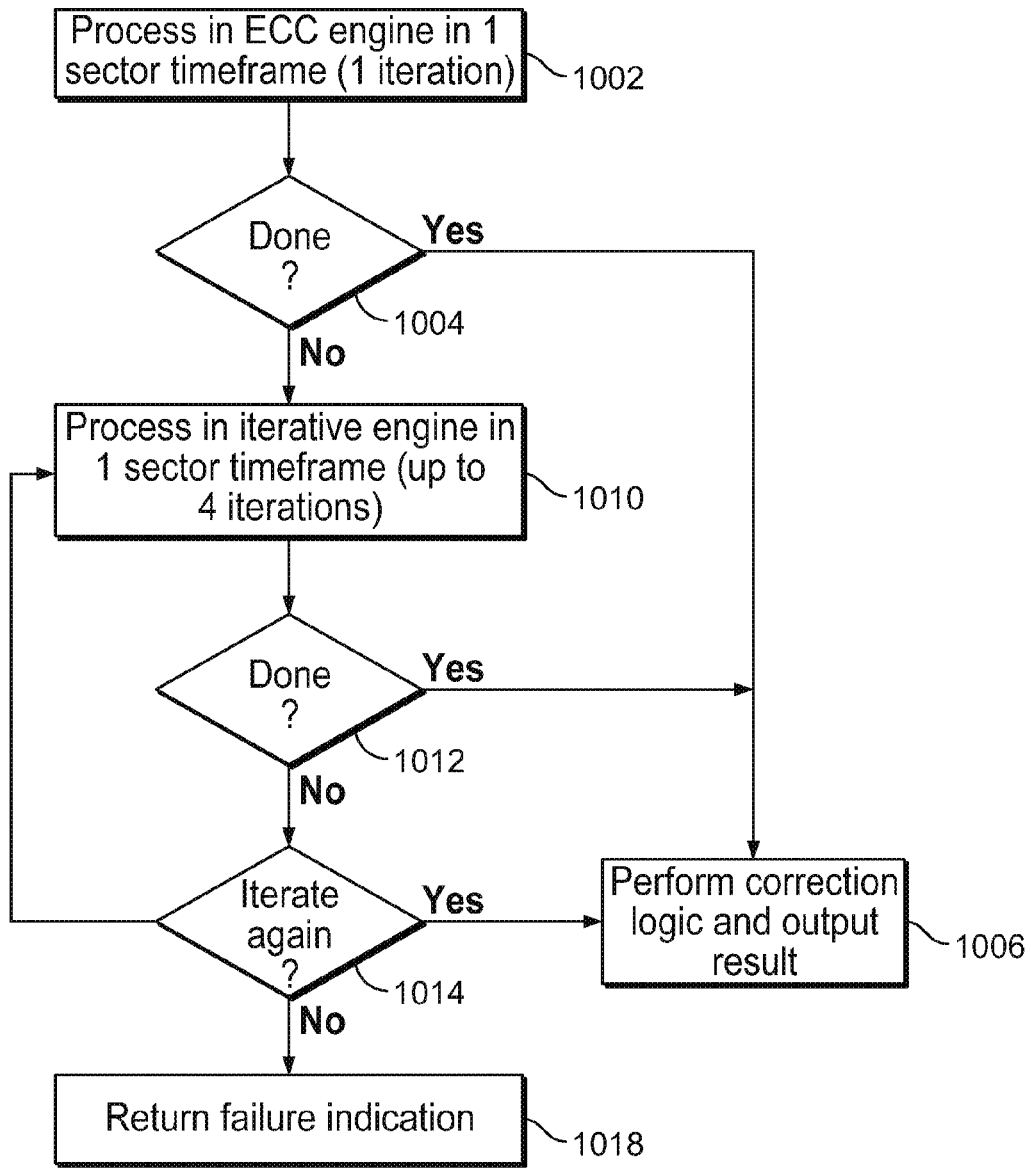
FIG. 10 is a flowchart illustrating an embodiment of a process for decoding data.

FIG. 10 is a flowchart illustrating an embodiment of a process for decoding data. For example, this process may be performed by decoder 900. In some embodiments, this process is used to perform 208 in FIG. 2 or 308 in FIG. 3. In this example, the received data frame is a sector.

In the example shown, at 1002, the received sector is processed in the ECC engine in one sector timeframe. In this example, processing one sector takes ½ sector timeframe. Therefore, a second received sector may also be processed in that same sector timeframe.

At 1004, it is determined whether the ECC engine is done processing the sector. If it determined to be done, then correction information is sent from the ECC engine to the correction logic. At 1006, correction logic is performed and the result is output, e.g., the corrected sector is output. If it is not done, then at 1010, it is processed in an iterative engine in one sector timeframe. The iterative engine can process up to 4 iterations in each sector timeframe. At 1012, it is determined whether the iterative engine is done processing the sector. If it is done, then at 1006, correction logic is performed and the result is output, e.g., the corrected sector is output. If it is not done, then it is determined whether to process the sector again through the iterative engine at 1014. For example, a limit may be set on the number of times a sector can be processed in the iterative engine. If the decision is to iterate again, the process returns to 1010 and the sector is processed through the iterative engine again. If the decision is to not iterate again, then at 1018, an indication of failure is returned. In other words, the decoder gives up attempting to decode the sector and returns an indication of this.

Figure 11:
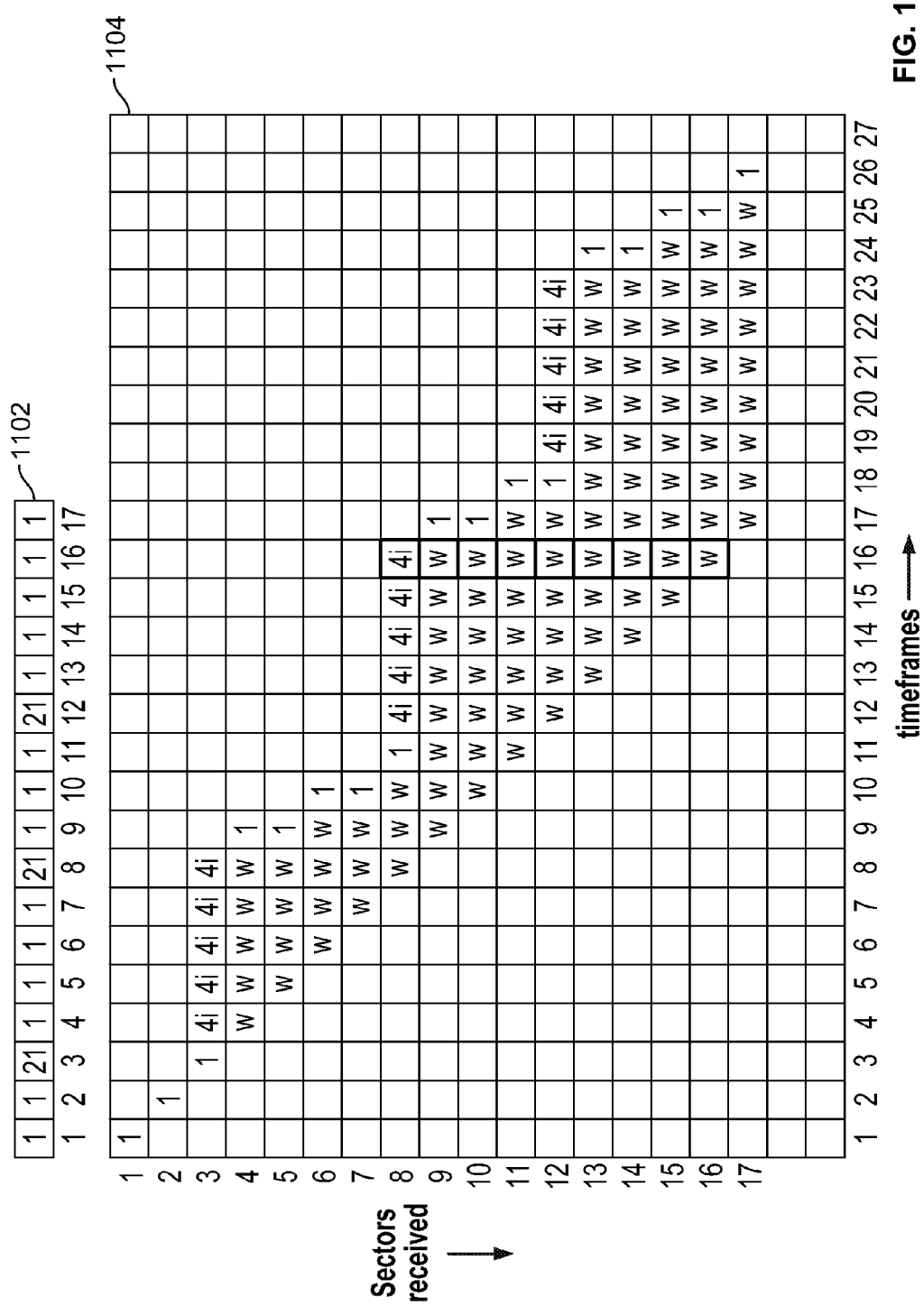
FIG. 11 is a diagram illustrating an example of data sectors processing in order through decoder 900 according to the process of FIG. 10.

FIG. 11 is a diagram illustrating an example of data sectors processing in order through decoder 900 according to the process of FIG. 10.

In this example, data sector profile 1102 includes a total of 17 sectors (corresponding to 17 boxes), entering the soft ECC decoder from left to right. The first sector (sector 1) corresponds to the first (left most) box, the second sector (sector 2) corresponds to the second box, and the 17th sector (sector 17) corresponds to the 17th (right most) box. The numbers in each box indicate the number of iterations required for that particular sector. For example, 1 means no iteration is needed and the data only goes through a computation in the ECC engine (in a ½ timeframe). 21 means after the processing in the ECC engine, 20 more iterations are needed in the iterative engine. Because the iterative engine can process 4 iterations per timeframe, this means it will take 5 more timeframes to process through the iterative engine. A sector requiring 21 iterations therefore will take 6 timeframes to process through the soft ECC decoder (1 timeframe through the ECC engine and 5 timeframes through the iterative engine.) For purposes of explanation, the time that it takes to process a sector through correction logic 906 is assumed to be 0 in the examples herein.

Diagram 1104 shows the latency experienced by each data sector as the data sectors corresponding to data sector profile 1102 are processed through the soft ECC decoder for the case of in order processing, i.e., with the sectors being processed through the decoder in the order in which they were received. In this example, each column corresponds to a sector timeframe, with time increasing from left to right. Each row corresponds to a received sector, where the first received sector corresponds to the first row, the second received sector corresponds to the second row, etc.

The number in each box indicates the number of iterations performed in that timeframe for a particular sector. "w" means the data sector is waiting in memory without any processing being performed on that data sector. 4i means 4 iterations are performed in the iterative engine. As the iterative engine can only do 4 iterations in each sector timeframe, the sum of numbers in each column should not be higher than 4. The received sectors are shown in data sector profile 1102. One sector is received per timeframe.

The way this diagram works is as follows. The first sector received corresponds to the first (left most) box of data sector profile 1102. The first box contains "1", which means it requires 1 iteration to be complete. Referring to diagram 1104, the box in the first row and first column corresponds to the first sector received. Because it takes 1 iteration to be complete, the first sector is fully processed during the first timeframe (i.e., first column, since each column corresponds to a timeframe).

Jumping ahead, the third received sector requires 21 iterations, as shown in data sector profile 1102. In diagram 1104, in timeframe 3, sector 3 is received. In timeframe 4, sector 3 is processed through the ECC. In timeframes 5-9, sector 3 is processed by the iterative engine at 4 iterations per timeframe (as indicated by "4i").

In the meantime, at each timeframe, a new data sector is received and must wait. By timeframe 8, when the iterative soft ECC decoder finishes processing sector 3, there is a queue of 5 sectors waiting to be processed. At timeframe 9, sector 9 is received and must wait. However, the next sector in the queue in memory (sector 4) can now be processed. It only takes 1 iteration, so the next sector (sector 5) can also be processed in the same timeframe. This is because the ECC engine is able to process 2 sectors in a timeframe. Therefore, during timeframe 9, both sectors 4 and 5 are processed. However, there is still a queue of 4 sectors in memory waiting to be processed. Even though all sectors are received by timeframe 17, it is not until timeframe 26 when they are all finished being processed through the soft ECC decoder.

The maximum memory size needed for the in order case is 9 sectors. This is indicated by the boxes in bold. The boxes in bold show that at that point in time (timeframe 16), 1 sector is being processed in the iterative engine and 8 sectors are waiting in memory. In order processing produces output data in the order in which it came in. This allows straightforward data flow management but a larger memory size may be required. Also, the processing latency may be higher.

A sector that requires processing in the iterative engine blocks the flow of a subsequent data sector, which waits until the sector is finished being processed through the iterative engine before it can be processed. To maintain an in-order data output, incoming data needs to occupy memory space to wait for a sector to finish being processed through the iterative engine before it can be processed. In this example, a memory size of 9 data sectors is needed for this.

Figure 12:
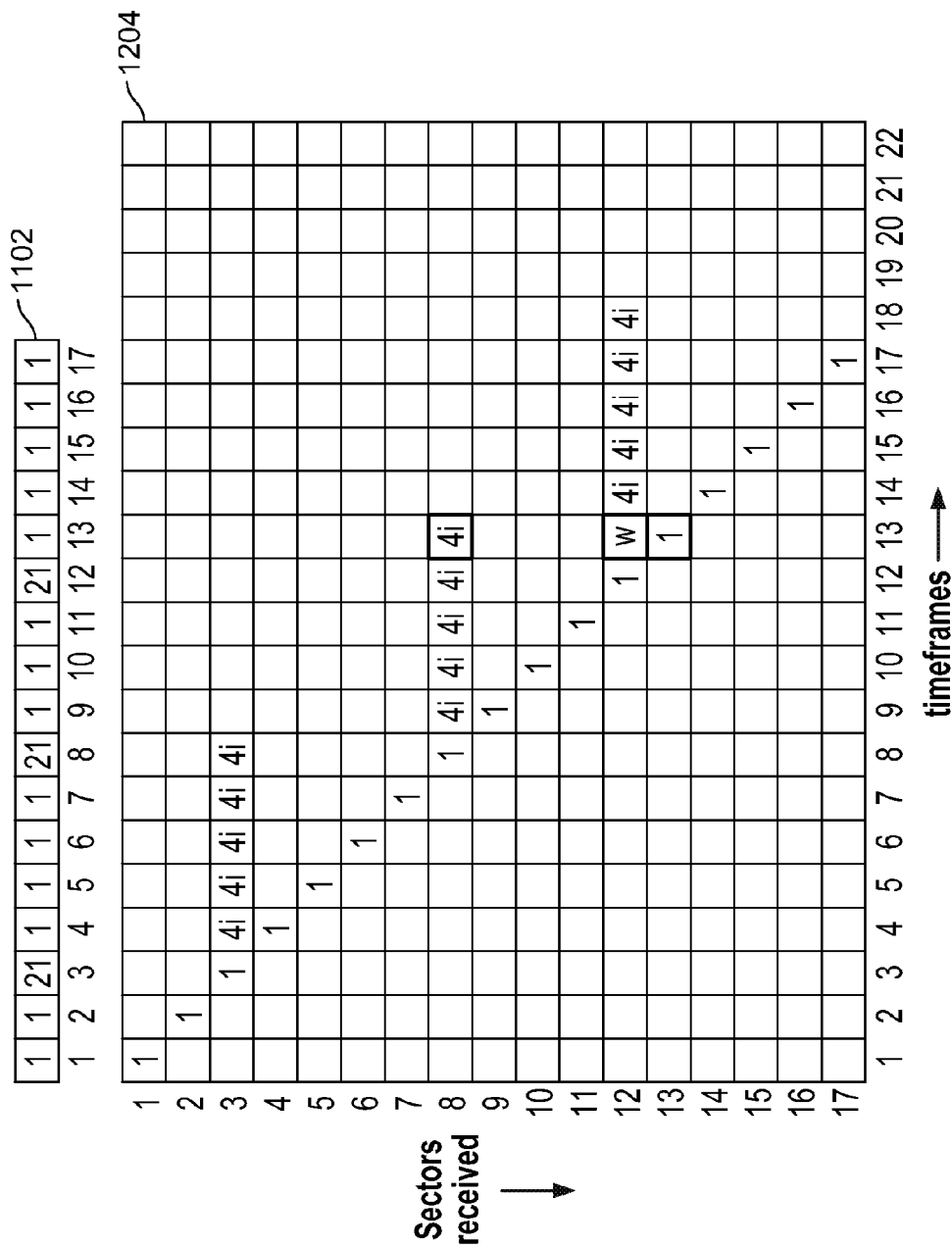
FIG. 12 is a diagram illustrating an example of data sectors processing out of order through decoder 900 according to the process of FIG. 10.

FIG. 12 is a diagram illustrating an example of data sectors processing out of order through decoder 900 according to the process of FIG. 10. In this example, the same data sector profile 1102 is received.

Diagram 1204 shows the latency experienced by each data sector as the data sectors corresponding to data sector profile 1102 are processed through the LDPC decoder for the case of out of order processing, i.e., the sectors are not necessarily processed through the decoder in the order in which they were received. In the out of order case, data that requires shorter processing time can move ahead of data that requires a longer processing time. The output order depends also on the error profile of the incoming data instead of the input sequence alone. In some embodiments, the out of order execution requires minor modifications on data flow handling compared to the in order execution case.

Sectors 1-3 are processed in a similar manner to that shown in FIG. 11. At timeframe 3, sector 3 is received. Sector 3 requires 21 iterations, as shown in data sector profile 1102. 1 iteration is performed in the ECC engine in the first frame, followed by 4 iterations in each of timeframes 4-8 (as indicated by "4i"). In the meantime, at each timeframe, a new data sector is received and can be immediately processed by the ECC engine, which is no longer processing sector 3. Sector 3 is being processed by the iterative engine.

In this example, the only wait occurs at timeframe 13, when sector 13 is received while sector 12 is finished being processed in the ECC engine, but is waiting to be processed in the iterative engine (which is processing sector 8). At timeframe 14, the iterative engine becomes free (finishes processing sector 8), sector 12 moves to the iterative engine for processing, and sector 13 is able to be processed.

Referring back to FIG. 1, the ECC engine can be considered a first stage and the iterative engine can be considered a second stage of processing in ECC decoder 100. In this case, stage 2 is conditional. Once a sector is finished being processed in stage 1, another sector may begin being processed in stage 1.

As shown by diagram 1204, latency is reduced compared to diagram 1104 In other words, at any given time in memory, there are fewer sectors waiting to be processed by the iterative ECC decoder than in the in order processing case described in FIG. 11. In this case, by the time sector 17 is received, sector 17 can be immediately processed, and therefore it takes 17 timeframes to process the 17 sectors of data sector profile 1102.

In this out of order execution case, the memory size requirement may be significantly reduced compared to the in order case. In this example, the maximum memory size needed is 3 sectors, as indicated by the boxes in bold compared to a required memory size of 9 sectors in the in order case of FIG. 11. The boxes in bold show that at that point in time (timeframe 13), one sector is being processed in the iterative engine, one sector is waiting to be processed in the iterative engine, and one sector is being processed in the ECC engine. In addition, the total processing time is reduced. Total processing takes 17 timeframes (as opposed to 26 timeframes in the in order case shown in FIG. 7).

If out-of-order processing is performed, subsequent sectors can pass ahead of the iterative engine if they don't require iterative processing. The maximum memory size needed in this example is 3 data sectors, greatly reduced when compare to the in-order example.

In this example, the RS is a faster decoder than the LDPC, and thus, out of order processing can benefit a system in which one stage is faster or slower than another stage.

Figure 13:
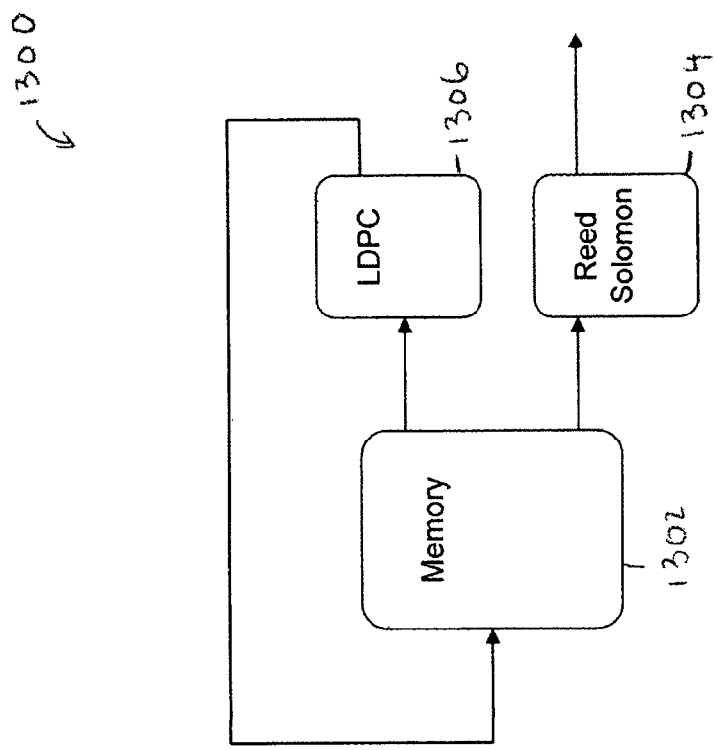
FIG. 13 is a block diagram illustrating an embodiment of a Reed Solomon (RS) and LDPC decoder.

FIG. 13 is a block diagram illustrating an embodiment of a Reed Solomon (RS) and LDPC decoder. In the example shown, decoder 1300 is an example of decoder 100. Decoder 1300 includes memory 1302, LDPC decoder 1306, and RS decoder 1304. In some embodiments, LDPC decoder 1306 is a slower decoder than RS decoder 1304.

In some embodiments, RS 1304 is used to determine if a sector is correctable and, if so, performs the correction. If the sector is not correctable, then reliability information, e.g., log likelihood ratio (LLR) is modified by LDPC 1306, written back into memory 1302, and then used by RS 1304 to perform error correction coding again using the updated reliability information.

In this example, 1 sector timeframe includes 4 iterations. Reed Solomon processing takes half sector timeframe which is equivalent to processing time unit of 2 iterations. For Reed Solomon, the half-sector processing timeframe and 2-iterations timeframe are interchangeable throughout this example. LDPC processing takes 8 iterations. Therefore, within 1 timeframe, RS 1304 can process up to 2 sectors. LDPC 1306 takes 2 timeframes to process 1 sector.

An example of processing through decoder 1300 is more fully described below.

Figure 14:
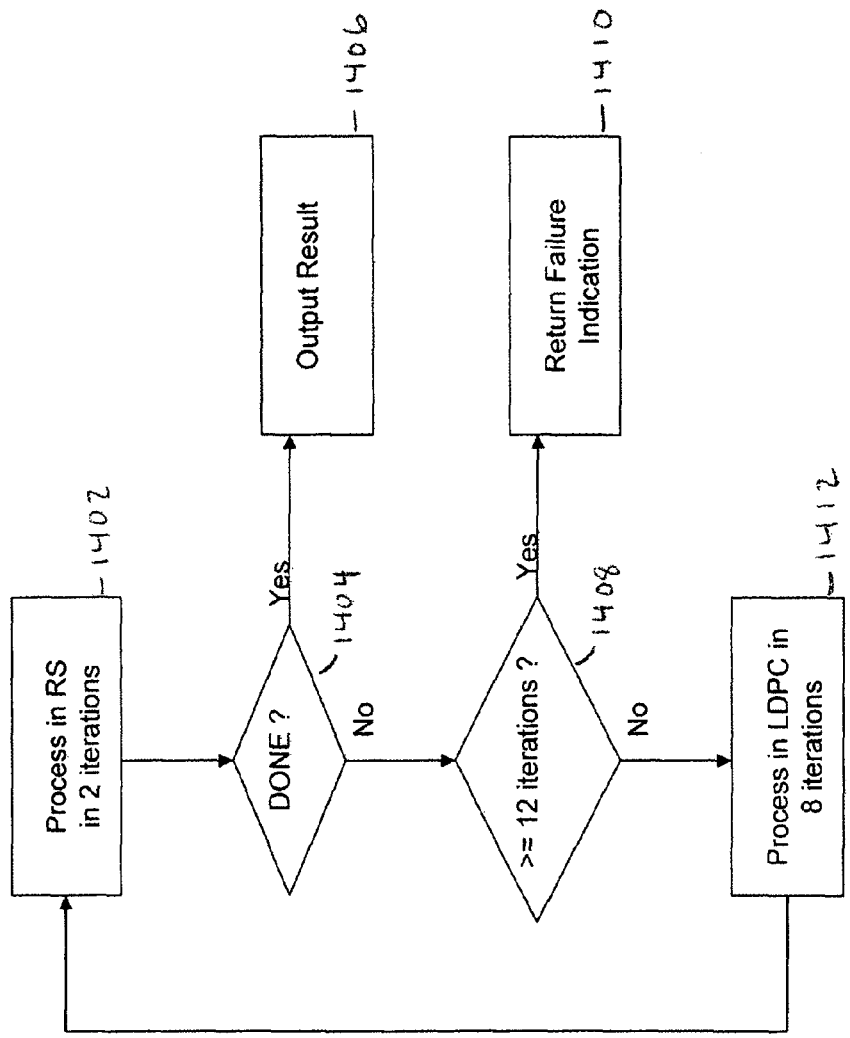
FIG. 14 is a flowchart illustrating an embodiment of a process for decoding data.

FIG. 14 is a flowchart illustrating an embodiment of a process for decoding data. For example, this process may be performed by decoder 1300. In some embodiments, this process is used to perform 208 in FIG. 2 or 308 in FIG. 3. In this example, the received data frame is a sector.

In the example shown, at 1402, a received sector is processed in the RS decoder in half sector timeframe (i.e. 2 iterations). At 1404, it is determined whether the RS decoder is done processing the sector, e.g., if the sector is decoded and corrected. If it determined to be done, then the result is output at 1406, e.g., the corrected sector is output. If it is not done, then at 1408, it is determined whether 12 or more iterations have been spent processing this sector. If 12 or more iterations have been performed, a failure indication is returned at 1410. If fewer than 12 iterations have been performed, then the sector is processed by the LDPC in 8 iterations at 1412. The process returns to 1402. For example, the LDPC decoder outputs modified LLR data that is fed into the RS decoder. In this particular embodiment, a process always ends with Reed Solomon processing (and never with LDPC processing) and therefore Reed Solomon processing (step 1402) follows LDPC processing without, for example, checking whether to end the process by outputting a result, returning a failure indication, etc. Although 12 is the maximum number of iterations used in this example, other values are used in other embodiments.

Figure 15:
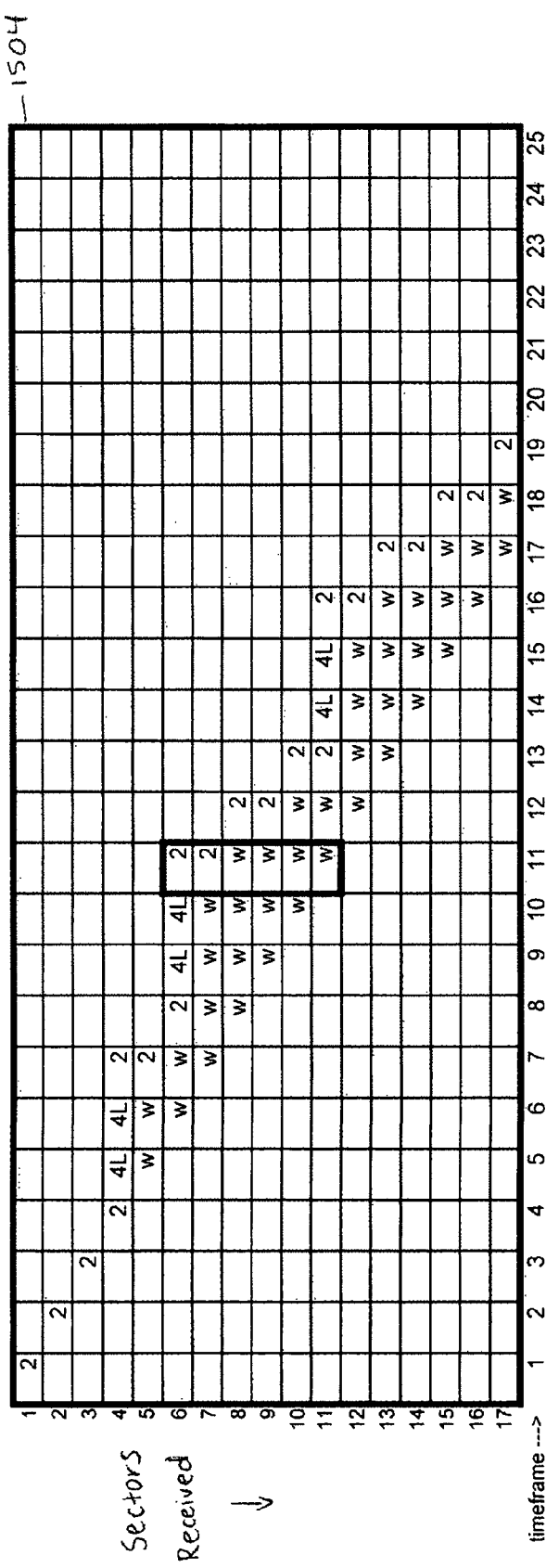
FIG. 15 is a diagram illustrating an example of data sectors processing in order through decoder 1300 according to the process of FIG. 14.

FIG. 15 is a diagram illustrating an example of data sectors processing in order through decoder 1300 according to the process of FIG. 14. The same example sequence of data sectors will be processed in subsequent figures using the techniques described herein to illustrate some advantages compared to processing the data sectors in order as shown in this figure.

In this example, data sector profile 1502 includes a total of 17 sectors (corresponding to 17 boxes) which entering or are otherwise passed to the Reed Solomon decoder and (if needed) then to an LDPC decoder from left to right. The numbers in each box indicate the number of iterations required to process that particular sector. For example, in the case of sector 4, 12 iterations means processing that sector requires 2 iterations (half sector timeframe) in the first round of Reed Solomon decoding, 4+4=8 iterations (2 sector timeframes) in the LDPC decoding, and 2 iterations (half sector timeframe) in the second round of Reed Solomon decoding. In general, a sector with a larger signal to noise ratio will tend to have a lower number of iterations since relatively little error correction processing needs to be performed whereas a "noisy" sector will tend to have a large number of iterations. For example, sector 4 tends to have more noise (and thus requires more processing) than sector 1.

Diagram 1504 shows the latency experienced by each data sector as the data sectors corresponding to data sector profile 1502 are processed through the RS and LDPC decoder for the case of in order processing, i.e., with the sectors being processed through the decoder in the order in which they were received. In this example, each column corresponds to a sector timeframe, with time increasing from left to right. Each row corresponds to a received sector, where the first received sector corresponds to the first row, the second received sector corresponds to the second row, etc.

The number in each box indicates the number of iterations performed in that timeframe for a particular sector. "w" means the data sector is waiting in memory without any processing being performed on that data sector. 4L means 4 iterations are performed in the LDPC decoder. The received sectors are shown in data sector profile 1502. One sector is received per timeframe.

In this example, the first sector received corresponds to the first (left most) box of data sector profile 1502. Sector 1 requires 2 iterations to be processed. Referring to diagram 1504, the box in the first row and first column corresponds to the first sector received. Because it takes 2 iterations to be complete, the first sector is fully processed during the first timeframe (i.e., first column, since each column corresponds to a timeframe).

In the second column, sector 2 is received. As shown in data profile 1502, sector 2 requires 2 iterations. As shown in diagram 1504, the 2 iterations are completed within sector 2.

Jumping ahead, the fourth received sector (i.e., row 4) requires 12 iterations, as shown in data sector profile 1502. In diagram 1504, in the fourth column, sector 4 is received. 2 iterations of Reed Solomon processing are performed in the fourth timeframe (i.e., fourth column), 4 iterations of LDPC related processing are performed in the fifth timeframe (as indicated by "4L"), 4 iterations in the LDPC are performed in the sixth timeframe, etc. In the meantime, at each timeframe, a new data sector is received and must wait (as indicated by "w") until previous sectors have finished in the receive order. For example, sector 5 is received in the fifth timeframe and must wait until sector 4 finishes at the seventh timeframe (as indicated by a "w" in the fifth row and fifth and sixth columns). Processing of the fifth sector does not begin until the seventh timeframe (see, e.g., the fifth row and the seventh column). At the seventh timeframe (timeframe 7), sector 4 only requires 2 iterations of Reed Solomon to finish and there are 4 total Reed Solomon iterations in one timeframe. Sector 5 can therefore be processed in the second half of timeframe 7 after the RS decoder has finished processing sector 4. Even though all sectors are received by timeframe 17, it is not until timeframe 19 when they are all finished being processed through the RS and LDPC decoder.

The minimum memory size needed to properly process the data sectors for the in order case is 6 sectors worth of space, indicated by the boxes in bold in column 11. The boxes in bold show that at that point in time (timeframe 11), 2 sectors are being processed in the Reed Solomon decoder and 4 sectors are waiting in memory. In order processing produces output data in the order in which it came in. This allows straightforward data flow management but a larger memory size may be required. Also, the processing latency may be higher.

Figure 16:
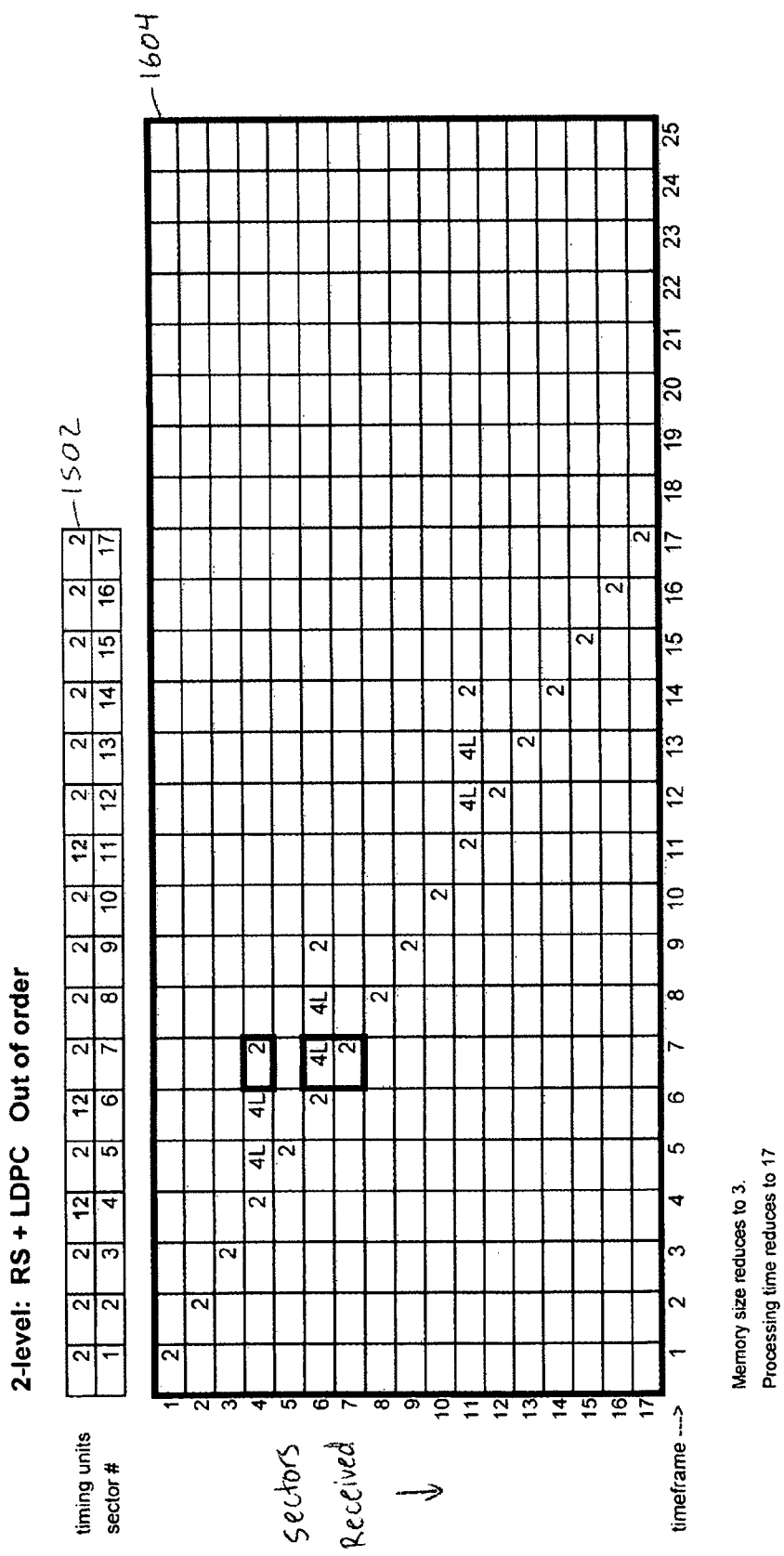
FIG. 16 is a diagram illustrating an embodiment of data sectors processing out of order through decoder 1300 according to the process of FIG. 14.

FIG. 16 is a diagram illustrating an embodiment of data sectors processing out of order through decoder 1300 according to the process of FIG. 14. In this example, the same data sector profile 1502 processed in FIG. 15 is received. In this example, the data sectors are processed out of order. That is, a sector which is received later or has a higher sector number can be processed (if so desired) before another sector which is received earlier or has a lower sector number.

Diagram 1604 shows the latency experienced by each data sector as the data sectors corresponding to data sector profile 1502 are processed through the RS and LDPC decoder for the case of out of order processing, i.e., the sectors are not necessarily processed through the decoder in the order in which they were received. In the out of order case, data that requires shorter processing time can (for example) be moved ahead of data that requires a longer processing time. The output order depends also on the error profile of the incoming data instead of the input sequence alone. In other words, depending on the distribution of errors in the sequence of data sectors, the order of the outputs will vary. In some embodiments, the out of order execution requires some modifications to an existing data flow handling compared to the in order execution case.

Sectors 1-4 are processed in a similar manner to that shown in FIG. 15. At timeframe 4, sector 4 is received. Sector 4 requires 12 iterations, as shown in data sector profile 1502. 2 iterations of Reed Solomon processing are performed in the fourth timeframe (i.e., fourth column), 4 iterations of LDPC processing are performed in the fifth timeframe, 4 iterations of LDPC processing are performed in the sixth timeframe, etc. In the meantime, at each timeframe, a new data sector is received. At timeframe 5, sector 4 is processed by the LDPC decoder and simultaneously sector 5 is processed by the RS decoder. Since the two decoders operate independently, each decoder may work on a different piece of data at the same time. At the seventh timeframe (timeframe 7), data sector 7 is received. Sector 4 only requires two iterations of Reed Solomon processing and there are 4 total Reed Solomon iterations in one timeframe. Sector 7 can therefore be processed in the second half of timeframe 7 after the RS decoder has finished processing sector 4.

Referring back to FIG. 1, the LDPC can be considered a first stage and the SOVA engine can be considered a second stage of processing in ECC decoder 100. In this particular embodiment, if a data frame is processed in the second stage, it always returns to the first stage. Stage 2 is conditional. Once a sector is finished being processed in stage 1, another sector may begin being processed in stage 1.

As shown by diagram 1604, latency is reduced compared to diagram 1504 (the in order processing case). Note for example, the case of sector 5 in FIGS. 15 and 16. In FIG. 15, sector 5 has a latency of three timeframes whereas in FIG. 16 there is a latency of 1 timeframe.

In this out of order execution case, the memory size requirement may be significantly reduced compared to the in order case. In this example, a minimum memory size of 3 sectors worth of data is required, as indicated by the boxes in bold compared to a required memory size of 6 sectors in the in order case of FIG. 15. The boxes in bold show that during that timeframe (timeframe 7), sector 4 is processed in the RS decoder, sector 6 is processed in the LDPC decoder, and sector 7 is processed in the RS decoder. In addition, the total processing time is reduced. Total processing takes 17 timeframes (as opposed to 19 timeframes in the in order case shown in FIG. 15).

Figure 17:
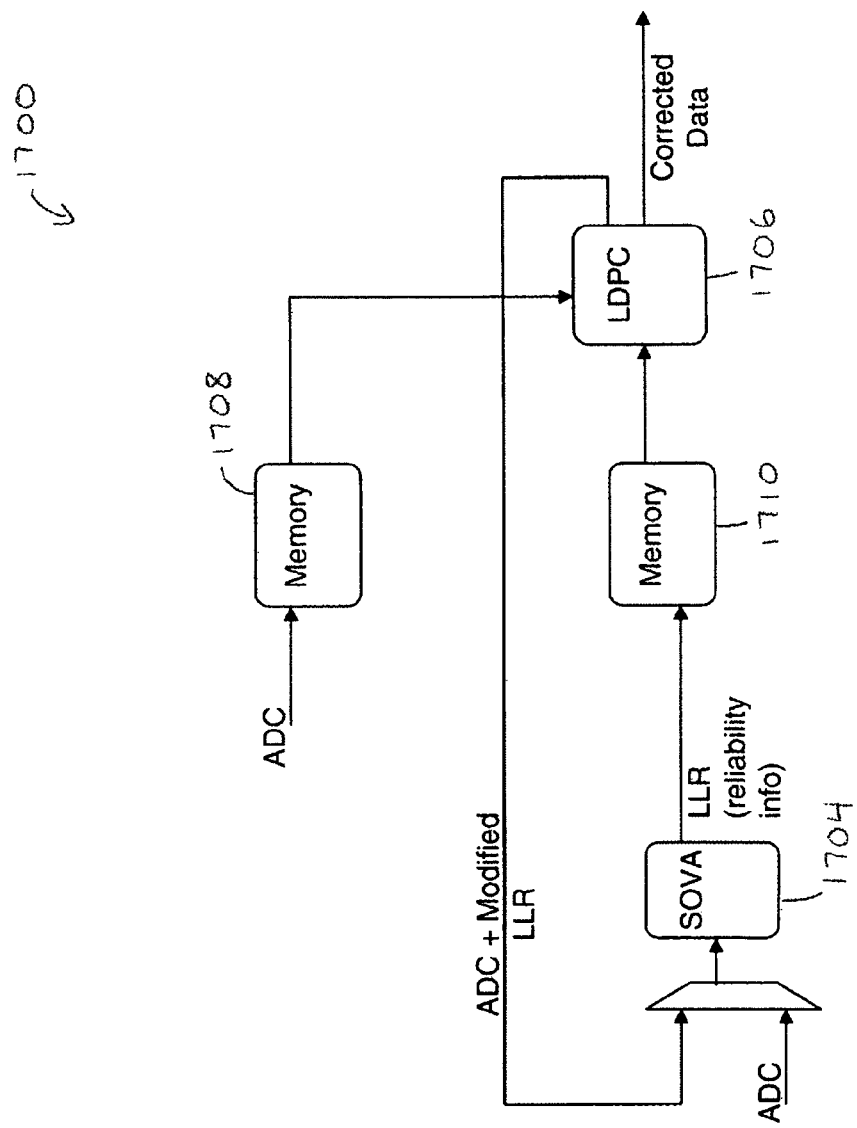
FIG. 17 is a block diagram illustrating an alternative embodiment of an iterative LDPC decoder.

FIG. 17 is a block diagram illustrating an alternative embodiment of an iterative LDPC decoder. In some embodiments, SOVA engine 1704 is already used in a hard disk channel device (or wireless or other device) and therefore any SOVA engine used by a decoder can be shared (i.e. LDPC decoder in this example). In the example shown, decoder 1700 is an alternative embodiment of iterative LDPC decoder 500 and is an example of decoder 100. In this example, decoder 1700 is shown to include memory 1708, memory 1710, LDPC decoder 1706, and Soft Output Viterbi Algorithm (SOVA) (engine) 1704. LDPC decoder 1706 performs LDPC decoding and decoder 1700 performs iterative LDPC decoding. Reliability information is provided as input to decoder 1700. In some embodiments, data is received from an analog to digital converter (ADC) and provided as input to SOVA 1704. Corrected data is output.

In this example, SOVA 1704 is time slot shared between a hard disk channel and LDPC decoder 1706. For example, the multiplexer in front of SOYA 1704 can be configured at appropriate times to select the proper input path. SOVA 1704 can be used with LDPC decoder 1706 during the time when the servo gate is high (idle), as shown in FIG. 18.

FIG. 18 is a diagram illustrating an example timing diagram. In this example, the servo gate is on longer than a sector timeframe and only sector 2 requires SOVA processing in addition to LDPC processing; the other sectors are all corrected by a single run in the LDPC. A sector timeframe is the time it takes to receive one sector.

When servo gate 1802 is low, data is received from a hard disk channel (or wireless channel or other source) and is processed by SOVA 1804. As shown, sectors 1-12 are received and processed by SOVA 1804 when servo gate 1802 is low (active). When the servo gate is high (idle), no sectors are received. Therefore, the SOVA can be used to process sector 2 while the SOVA is idle (during the second pulse of servo gate 1802), followed by a second LDPC decode iteration of sector 2 (for example, immediately following the high-to-low transition of the second pulse of servo gate 1802). As shown, sector 2, which requires SOVA processing, is processed in SOVA 1804 for a second time while servo gate 1802 is high.

In some embodiments, the servo gate is on for less than one sector timeframe. In this case, the sharing of the SOYA can be divided into more than one servo gate per region.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of processing a sequence of data frames in an error correction code (ECC) decoder, including:
   receiving a first data frame in the sequence of data frames;
   using a processor to initiate processing of the first data frame using the ECC decoder that includes a faster stage and a slower stage;
   receiving a second data frame from the input sequence of data frames; and
   using the processor to initiate processing of the second data frame through the ECC decoder before the first data frame is finished being processed using the ECC decoder.

2. A method as recited in claim 1, wherein the faster stage includes a Reed Solomon decoder.

3. A method as recited in claim 1, wherein the slower stage includes a low density parity check (LDPC) decoder.

4. A method as recited in claim 1, wherein the ECC decoder includes one or more iterative stages.

5. A method as recited in claim 1, wherein the ECC decoder outputs a corrected second data frame corresponding to the second data frame before outputting a corrected first data frame corresponding to the first data frame.

6. A method as recited in claim 1, wherein the ECC decoder outputs a corrected second data frame corresponding to the second data frame before outputting a corrected first data frame corresponding to the first data frame, and the method further includes reordering the corrected second data frame and the corrected first data frame.

7. A method as recited in claim 1, wherein the ECC decoder includes a soft output Viterbi algorithm (SOVA) processing stage.

8. A method as recited in claim 1, wherein the ECC decoder uses reliability information.

9. A method as recited in claim 1, wherein the data frames are associated with disk sectors.

10. A method as recited in claim 1, wherein the data frames are associated with a disk drive system.

11. A method as recited in claim 1, wherein the ECC decoder includes a shared decoder that is also used to process received data.

12. A method as recited in claim 1, wherein the ECC decoder includes a shared decoder that is also used to process data received from a hard disk channel.

13. A system for processing a sequence of data frames in an error correction code (ECC) decoder, including:
   a processor configured to:
      receive a first data frame in the sequence of data frames;
      initiate processing of the first data frame using the ECC decoder that includes a faster stage and a slower stage;
      receive a second data frame from the input sequence of data frames; and
      initiate processing of the second data frame through the ECC decoder before the first data frame is finished being processed using the ECC decoder; and
   a memory coupled with the processor, wherein the memory provides the processor with instructions.

14. A computer program product for processing a sequence of data frames in an error correction code (ECC) decoder, the computer program product being embodied in a non-transitory computer readable medium and comprising computer instructions for: receiving a first data frame in the sequence of data frames; storing the first data frame; initiating processing of the first data frame using the ECC decoder that includes a faster stage and a slower stage; receiving a second data frame from the input sequence of data frames; storing the second data frame; and initiating processing of the second data frame through the ECC decoder before the first data frame is finished being processed using the ECC decoder.

15. A method of processing a sequence of data frames in an error correction code (ECC) decoder, including:
   receiving a first data frame in the sequence of data frames;
   using a processor to initiate processing of the first data frame using the ECC decoder;
   receiving a second data frame from the input sequence of data frames; and
   using the processor to initiate processing of the second data frame using the ECC decoder before the first data frame is finished being processed using the ECC decoder;
   wherein the ECC decoder includes a shared decoder that is also used to process received data.

16. A method as recited in claim 15, wherein the received data is received from a hard disk channel.

17. A method as recited in claim 15, wherein the shared decoder is a Soft Output Viterbi Algorithm (SOVA) engine.

18. A method as recited in claim 15, wherein the shared decoder is used to process a data frame using the ECC decoder when a servo gate value corresponds to an idle value.

19. A method as recited in claim 15, wherein the ECC decoder includes two or more stages, and wherein processing of the second data frame is initiated after the first data frame is finished processing through a first stage of the ECC decoder.

20. A method as recited in claim 15, wherein the ECC decoder includes one or more iterative stages.

21. A method as recited in claim 15, wherein the ECC decoder outputs a corrected second data frame corresponding to the second data frame before outputting a corrected first data frame corresponding to the first data frame.

22. A system for processing a sequence of data frames in an error correction code (ECC) decoder, including:
   a processor configured to:
      receive a first data frame in the sequence of data frames;
      initiate processing of the first data frame through the ECC decoder;
      receive a second data frame from the input sequence of data frames; and
      initiate processing of the second data frame through the ECC decoder before the first data frame is finished being processed through the ECC decoder; and
   a memory coupled with the processor;
   wherein the ECC decoder includes a shared decoder that is also used to process received data.

23. A computer program product for processing a sequence of data frames in an error correction code (ECC) decoder, the computer program product being embodied in a non-transitory computer readable medium and comprising computer instructions for: receiving a first data frame in the sequence of data frames; storing the first data frame; initiating processing of the first data frame through the ECC decoder; receiving a second data frame from the input sequence of data frames; storing the second data frame; and initiating processing of the second data frame through the ECC decoder before the first data frame is finished being processed through the ECC decoder; wherein the ECC decoder includes a shared decoder that is also used to process received data received.

* * * * *

UNITED STATES PATENT AND TRADEMARK OFFICE
CERTIFICATE OF CORRECTION

| | | |
|---|---|---|
| PATENT NO. | : 8,281,212 B1 | Page 1 of 1 |
| APPLICATION NO. | : 12/148777 | |
| DATED | : October 2, 2012 | |
| INVENTOR(S) | : Yeung et al. | |

It is certified that error appears in the above-identified patent and that said Letters Patent is hereby corrected as shown below:

On the title page under (75) Inventors, the first named inventor "Kwok Alfred Yeung" should be --Kwok W. Yeung--.

In the Claims

Claim 14, Column 17, Line 63:
delete "storing the first data frame;"

Claim 14, Column 18, Line 2:
delete "storing the second"

Claim 14, Column 18, Line 3:
delete "data frame;" before and

Claim 23, Column 18, Line 55:
delete "storing the first data frame;"

Claim 23, Column 18, Line 58:
delete "storing the second data frame;"

Signed and Sealed this
Third Day of June, 2014

Michelle K. Lee
*Deputy Director of the United States Patent and Trademark Office*